US006226716B1

(12) United States Patent
Bauman et al.

(10) Patent No.: US 6,226,716 B1
(45) Date of Patent: May 1, 2001

(54) TEST DRIVER FOR USE IN VALIDATING A CIRCUIT DESIGN

(75) Inventors: Mitchell A. Bauman, Circle Pines; David L. Ganske, Shoreview, both of MN (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/218,364

(22) Filed: Dec. 22, 1998

(51) Int. Cl.[7] .............................. G06F 13/00; G06F 9/00
(52) U.S. Cl. ..................... 711/145; 711/149; 711/156; 703/13; 714/741; 716/4
(58) Field of Search ..................... 711/145, 144, 711/149, 156, 119–124; 703/13, 14, 15; 702/108; 714/741; 716/4; 370/351; 712/205, 208

(56) References Cited

U.S. PATENT DOCUMENTS

| | | | |
|---|---|---|---|
| 5,386,514 | * | 1/1995 | Lary et al. .............................. 710/54 |
| 5,537,569 | * | 7/1996 | Masubuchi ........................... 711/121 |
| 5,600,579 | * | 2/1997 | Steinmetz, Jr. ......................... 703/13 |
| 5,734,922 | * | 3/1998 | Hagersten et al. ..................... 712/37 |
| 5,812,820 | * | 9/1998 | Loram ..................................... 703/20 |
| 5,848,434 | * | 12/1998 | Young et al. .......................... 711/144 |
| 5,963,726 | * | 10/1999 | Rust et al. .............................. 703/13 |
| 5,978,902 | * | 11/1999 | Mann .................................. 712/227 |
| 5,999,721 | * | 12/1999 | Colglazier ............................. 703/20 |
| 6,021,513 | * | 2/2000 | Beebe et al. ......................... 714/726 |
| 6,052,524 | * | 4/2000 | Pauna ..................................... 703/22 |
| 6,052,760 | * | 4/2000 | Bauman et al. ..................... 711/119 |
| 6,112,260 | * | 8/2000 | Colterjohn et al. .................... 710/31 |

\* cited by examiner

Primary Examiner—Do Yoo
Assistant Examiner—Hong Kim
(74) Attorney, Agent, or Firm—Charles A. Johnson; Mark T. Starr; Crompton, Seager and Tufte, LLC

(57) ABSTRACT

A test driver for use in validating an electronic circuit design is disclosed. The test driver not only provides stimulus and verifies the response of a circuit design, but also responds appropriately to requests provided by the circuit design. The test driver may also modify a selected portion of a data element before returning the data element to the circuit design. Under some test conditions, this helps verify that the test driver did in fact gain access to a data element during a particular test case.

23 Claims, 14 Drawing Sheets

SUB-PROCESSING MODULE (SUB-POD)

| Container 0 | PPD 0 Increment |
| --- | --- |
| Container 1 | Fixed Pattern |
| Container 2 | PPD 1 Increment |
| Container 3 | Fixed Pattern |
| Container 4 | PPD 2 Increment |
| Container 5 | Fixed Pattern |
| Container 6 | PPD 3 Increment |
| Container 7 | Fixed Pattern |

TEST DRIVER FOR USE IN VALIDATING A CIRCUIT DESIGN

CROSS-REFERENCE TO RELATED APPLICATIONS

This invention is related to U.S. patent application Ser. No. 09/218,384, filed Dec. 22, 1998, entitled "Method And Apparatus For Efficiently Generating Test Input For A Logic Simulator"; U.S. patent application Ser. No. 09/218,812, filed Dec. 22, 1998, entitled "Method and Apparatus For Synchronizing Independently Executing Test Lists For Design Verification"; U.S. patent application Ser. No. 09/219,285, filed Dec. 22, 1998, entitled "Method And Apparatus For Selectively Displaying Signal Values Generated By A Logic Simulator"; U.S. patent application Ser. No. 08/965,004, filed Nov. 5, 1997, entitled "A Directory-Based Cache Coherency System"; U.S. patent application Ser. No. 08/964,606, filed Nov. 5, 1997, now U.S. Pat. No. 6,014,709, entitled "Message Flow Protocol for Avoiding Deadlocks"; U.S. patent application Ser. No. 09/001,588, filed Dec. 31, 1997, entitled "High-speed Memory Storage Unit for a Multiprocessor System Having Integrated Directory and Data Storage Subsystems"; and U.S. patent application Ser. No. 09/001,592, filed Dec. 31, 1997, entitled "High-Performance Modular Memory System with Crossbar Connections", all assigned to the assignee of the present invention and all incorporated herein by reference.

TECHNICAL FIELD

This invention relates to the field of logic simulation of electronic circuits. More particularly, this invention relates to test drivers for use in validating an electronic circuit design.

BACKGROUND OF THE INVENTION

Gordon Moore, the cofounder of Intel Corporation, made an observation and prediction that semiconductor performance would double every 18 months, with the price of the new product remaining constant with the old. This observation is now referred to as Moore's Law, and has remained relatively accurate since the early 1970s. Moore's Law illustrates the rapid advancement that has and is taking place in the electronics industry. Because of this rapid advancement, the market window for many electronic products is relatively short, with faster and more powerful devices being continuously introduced. Accordingly, there is great pressure to reduce the development time for many products. To significantly reduce the development time for most electronic devices, the design time must be reduced, as the design process typically consumes a majority of the development cycle.

FIG. 1 shows a typical prior art design process for an ASIC (Application Specific Integrated Circuit) device. ASIC devices are commonly used to implement large and/or high performance circuit designs. In a first step, a hardware architect typically determines the requirements for the circuit design and formulates an underlying framework of the function and projected performance characteristics of the circuit design. The architect documents these ideas in a functional specification, as shown at step 12.

The design is then partitioned into a number of blocks and given to one or more logic designers for implementation. The logic designers create a detailed logic design using the functional specification as a guide. Rather than creating schematics, many logic designers express their design in a behavioral language such as VHDL (VHSIC Hardware Description Language), as shown at step 14. Many logic simulation tools can directly accept behavioral language descriptions as input. This not only improves efficiency in developing complex circuit designs, but also allows various sections of the circuit design to be functionally verified before the entire design is complete.

Next, and as shown at step 16, the design is typically logically simulated to verify the functionality thereof. To logically simulate the design, the circuit designer typically provides one or more test input files. The test input files may include a number of test conditions expressed as test vectors or the like. Each of the test vectors may include a value for selected inputs of the circuit design along with an expected circuit response. The logic simulator reads the test input files, simulates the behavior of the circuit design using the test input, and provides a simulated circuit response. The simulated circuit response is then compared to the expected circuit response to determine if the circuit design provides the expected behavior.

After logic simulation is complete, the design is typically passed to one or more physical designers, as shown at step 18. The physical designers place the various cells that represent the basic logic building blocks of the circuit design, and interconnect the cells using a routing tool. Timing information may be extracted and analyzed by both the physical and logical designers. Some timing problems can be fixed by the physical designer by adjusting the drive strengths of various components or placing cells in a different arrangement relative to each other. As shown at step 22, other timing problems can only be resolved by modifying the logic itself. If a problem is resolved by modifying the logic, the modified design must typically be re-verified by re-executing logic simulation step 16 and then the physical design step 18.

After all the logical and physical changes are made, and the design meets the stated requirements, the design is released for fabrication, as shown at step 24. Fabrication can take several months for a typical ASIC device. Once completed, the device is returned and tested, as shown at step 26. If the device does not meet the stated requirements, a design modification may be required as shown at step 22, forcing another design iteration of the logic simulation step 16, the physical design step 18, and the fabrication step 24. Once the device meets all of the stated requirements, the device is released, as shown at step 30.

In most design processes, it is important to reduce the number of design iterations that are required to produce a fully functional device. One way of reducing the number of design iterations is to increase the fault coverage of the test cases used during the logic simulation process. Increasing the fault coverage, however, tends to increase the time needed to generate and simulate the increased number of test cases. Thus, there is often a trade-off between an increased fault coverage and design cycle time.

FIG. 2 illustrates a prior art logic simulation process. At step 42, the architect and test designer discuss the logic implementation and define a series of test cases that address the various functional sections and possible interactions of the design. In many designs, such as a directory based MSU (Main Storage Unit) with multiple parallel ports and crossbar switches (see below), there are many possible functional operations and interactions that could and should be tested to achieve a high fault coverage. Some test cases can be defined relatively easily. Other test cases, such as those that test the parallel and often conflicting operations of the hardware, can be much more difficult to define and implement.

Once the test cases are defined, the test designer often codes the test cases into a format that can be used to produce an input for the logic simulator. This format may include, for example, a force command, followed by a run command, followed by a force command, etc. Test cases written in this format must typically be interpreted by the logic simulator, and more particularly, by a simulation control program of the logic simulator. The simulation kernel must usually be interrupted before the simulation control program can process a subsequent line in the coded test case. Because the simulation kernel must typically be regularly interrupted, the speed of the logic simulation can be significantly reduced.

To increase the speed of the logic simulation, a test driver may be used. A test driver is typically expressed using a behavioral language description and simulated along with the circuit design. Because the test driver can be actually simulated along with the circuit design, the test driver can stimulate the inputs of the circuit design without having to be interpreted by the simulation control program, and thus without having to interrupt the simulation kernel.

Prior to simulation, the test driver can be loaded with test data for controlling the inputs of the circuit design and verifying the results of a subsequent logic simulation. The test data can be stored in a memory structure expressed within the behavioral description of the test driver. For example, the test data may be loaded into a RAM structure within the test driver, and during logic simulation, the address to the RAM structure may be incremented to provide each of the test vectors to the inputs of the circuit design.

To generate the test data, a designer often codes the desired test cases into a standard programming language like "C", as shown at step 44. When executed, the "C" programs generate the test data, which as indicated above, is later loaded into a memory structure within the test driver, as shown at step 46. The "C" programs may also generate corresponding initialization files that can be loaded into the device under test (e.g. MSU RAMs). To perform the tests, clocks are issued (simulation starts), as shown at step 48.

During or at the end of the logic simulation, the results are checked to see if the test passed or failed, as shown at step 50. If the test failed, the results are analyzed to determine whether there was a test problem or an actual logic design problem, as shown at step 52. If a test problem is detected, the test is modified and re-executed as shown at step 56. If a logic problem exists, the logic design must be modified, as shown at step 54, and the logic simulations are re-executed to validate the change. When all of the defined test cases pass, as shown at step 58, the logic simulation process is complete.

A limitation of many prior art test drivers is that they only operate in a master-like mode, and not a slave-like mode. That is, many prior art test drivers only provide test vectors to the inputs of the circuit design, and then verify the response provided by the circuit design. Both of these operations are considered master-like operations because the test driver performs each operation regardless of the operation of the circuit design. If the circuit design does not provide the proper response, the test driver merely reports an error. Prior art test drivers typically do not have the ability to respond to requests provided by the circuit design. Responding to requests provided by a circuit design is considered a slave-like operation because the test driver must accept requests and respond accordingly.

By not providing a slave-like mode, prior art test drivers often cannot efficiently simulate those circuit designs that provide a request back to the test driver and expect a response. For example, in a directory-based multi-port MSU, a requesting port may request ownership of a data element within the MSU. The MSU typically checks the corresponding directory information to determine who currently owns the requested data element. If the MSU owns the requested data element, the MSU simply provides the data element to the requesting port to complete the operation. However, if another port currently owns the requested data element, the MSU typically must issue a return request to the owning port. The owning port must then return control of the data to the MSU before the MSU can provide the requested data to the requesting port. If the port driver models a port of the MSU and cannot respond to the return requests from the MSU, the MSU cannot provide the data to the requesting port. Therefore, prior art port drivers typically cannot be used for simulating these types of operations. Rather, these operations must typically be simulated at a higher simulation level, such as at a system level. However, it is known that it is most efficient to find and remove errors at the lowest simulation level of simulation. Higher simulation levels typically include significantly greater logic, require more simulation hardware resource, provide more redundant simulation of logic that already has been verified, and requires more debug time to trace a signal from the test source to the problem area.

Another limitation of many prior art test drivers is the inability to effectively simulate the interaction of dependent and/or conflicting requests within a circuit design. For many circuit designs, such as multi-port circuit designs, it is often desirable to independently control selected groups of inputs using separate and independently executed test lists. For example, it is often desirable to independently control each port of a multi-port MSU using separate and independently executed test lists. By providing independently executed test list, each port of the MSU is allowed to operate in a non-deterministic manner relative to the other ports. This, in turn, may allow the detection of design errors that can only be detected by simulating the interaction of dependent and/or conflicting requests.

When each of the ports is controlled by a separate and independently executed test list, it is often difficult to determine if a desired sequence of events actually occurred during the simulation. For example, in a test case that simulates the interaction of two independently operating ports of a directory based multi-port MSU, the sequence of events that occur in response to a request from one port may depend on the state of the MSU, including the current owner of the requested data element, and the state of the pending requests from other ports. Thus, if multiple ports request ownership of a common data element in the MSU, it is often difficult to determine by examining a final simulation result if each of the requesting ports actually received the data element, particularly if the MSU issues one or more return requests causing the return of the data element to the MSU during the test.

It would be desirable, therefore, to provide a test driver that can respond to requests provided by a circuit design. This may allow more varieties of circuits to be simulated at a lower level of logic simulation. It would also be desirable to provide a test driver that can help track the sequence of events that occur in response to certain test cases, and in particular, in response to those test cases where the sequence of events is difficult to determine by examining a final result.

SUMMARY OF THE INVENTION

The present invention overcomes many of the disadvantages of the prior art by providing an improved test driver for use in validating an electronic circuit design. In accordance with one aspect of the invention, the test drivers respond to requests provided by the circuit design, thereby allowing more varieties of circuits to be simulated at a lower level of logic simulation. In another aspect of the invention, the test drivers may help verify that a desired sequence of events occur in response to certain test cases, and in particular, to those test cases where the sequence of events is difficult to determine by examining a final result.

In an illustrative embodiment, a test driver is provided for controlling a group of inputs of a circuit design. The circuit design is preferably one that provides a response when selected inputs are subject to a first stimulus, and a request when selected inputs are subject to a second stimulus. Like the prior art, the test driver may stimulate the group of inputs with a first stimulus, and verify the response provided by the circuit design. Unlike the prior art, however, the test driver responds to selected requests provided by the circuit design. By receiving and responding to selected requests provided by the circuit design, the test driver may allow more varieties of circuit designs to be simulated at a lower level of logic simulation.

More specifically, the test driver may control one or more ports of a multi-port MSU. Thus, the test driver may be a port driver. Each port of the multi-port MSU is preferably controlled by a different port driver, and each port driver is preferably controlled by an independently executed test list. During functional simulation, each port driver may request ownership of selected cache lines in the multi-port MSU. When ownership is granted to a selected port driver, the selected port driver may fetch the selected cache line from the MSU, and store the cache line in a local cache store. The local cache store may include both a data portion and a tag portion, wherein the tag portion provides a correlation between selected cache lines in the data portion and corresponding cache lines in the multi-port memory module. The local cache provides a basis for responding to selected requests from the MSU including return requests, purge requests, etc.

Each port driver may further include an expected data store for storing a number of data packets including a number of expected read data packets. To verify that a response provided by the multi-port MSU matches an expected response, each port driver may include a compare block for comparing selected responses provided by the multi-port MSU with one of the expected data packets.

To control the port driver, an instruction store may be provided for storing a number of predetermined instructions. Selected instructions provides requests to the multi-port MSU, at least some of which may result in a response and/or request from the multi-port memory module to one of the port drivers. For example, a read type request may cause the multi-port MSU to issue a return request to the port driver that currently owns the requested cache line, and may then provide the requested cache line to the requesting port driver as a response.

A return controller may be provided for managing return requests from the multi-port MSU. As indicated above, return requests may request the return of selected cache lines from the local cache store of a selected port driver back to the MSU. To accomplish this, the return controller may receive the request, access the tag portion of the local cache to determine if the corresponding port driver has a copy of the selected cache line, and if so, return the requested cache line to the multi-port memory module. The return controller may also respond to purge requests provided by the multi-port MSU. For example, in response to a purge request, the return controller may purge selected cache lines from the local cache. The return controller may also initiate purge requests, for example when the local cache is full and cannot store a requested cache line or when selected cache lines have aged out.

Each port driver may further include a data modification block. The data modification block may help verify that a selected sequence of events has occurred during certain test cases. The data modification block may modify a requested cache line when the requested cache line is read into the port driver and/or when returned to the multi-port memory module (or other port driver). It is also contemplated that the data modification block may modify a requested cache line when the requested cache line is, for example, purged from the local cache by the port driver, or whenever any other predefined event occurs.

The data modification block preferably only modifies a selected portion of the cache line. For example, in a test case that simulates the interaction of two independently operating ports of a directory based MSU, the sequence of events that occurs in response to a request from one port may depend on the state of the MSU, including the current owner of the requested data element, and the state of any pending requests from the other ports. Therefore, if multiple ports request ownership to a common data element in the MSU, the data modification blocks of each of the port drivers may help determine which of the requesting ports actually gained access to the data element. That is, the circuit designer need only identify which portions of the cache line are modified during the test case to determine which port drivers actually gained access to the cache line. Thus, an unchanged portion of the cache line typically indicates that the corresponding port did not gain access to the requested data element. Preferably, the data modification block increments the designated portion of the requested cache line each time the cache line is received and/or written relative to the corresponding port driver. This may help a circuit designer determine how many times each port driver gained access to the cache line.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the Figures thereof and wherein.

DETAILED DESCRIPTION OF THE PREFERRED EMBODIMENTS

The detailed description which follows is presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

The present invention also relates to an apparatus for performing the operations. This apparatus may be specially constructed for the required purposes or it may comprise a general-purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression is input to the computer to control operations therein. It is contemplated that a number of source code expressions, in one of many computer languages, could be utilized to implement several aspects of the present invention. A variety of computer systems can be used to practice the present invention, including, for example, a personal computer, an engineering work station, a hardware simulator, an enterprise server, etc. The present invention, however, is not limited to practice on any one particular computer system, and the selection of a particular computer system can be made for many reasons.

Figure 1:
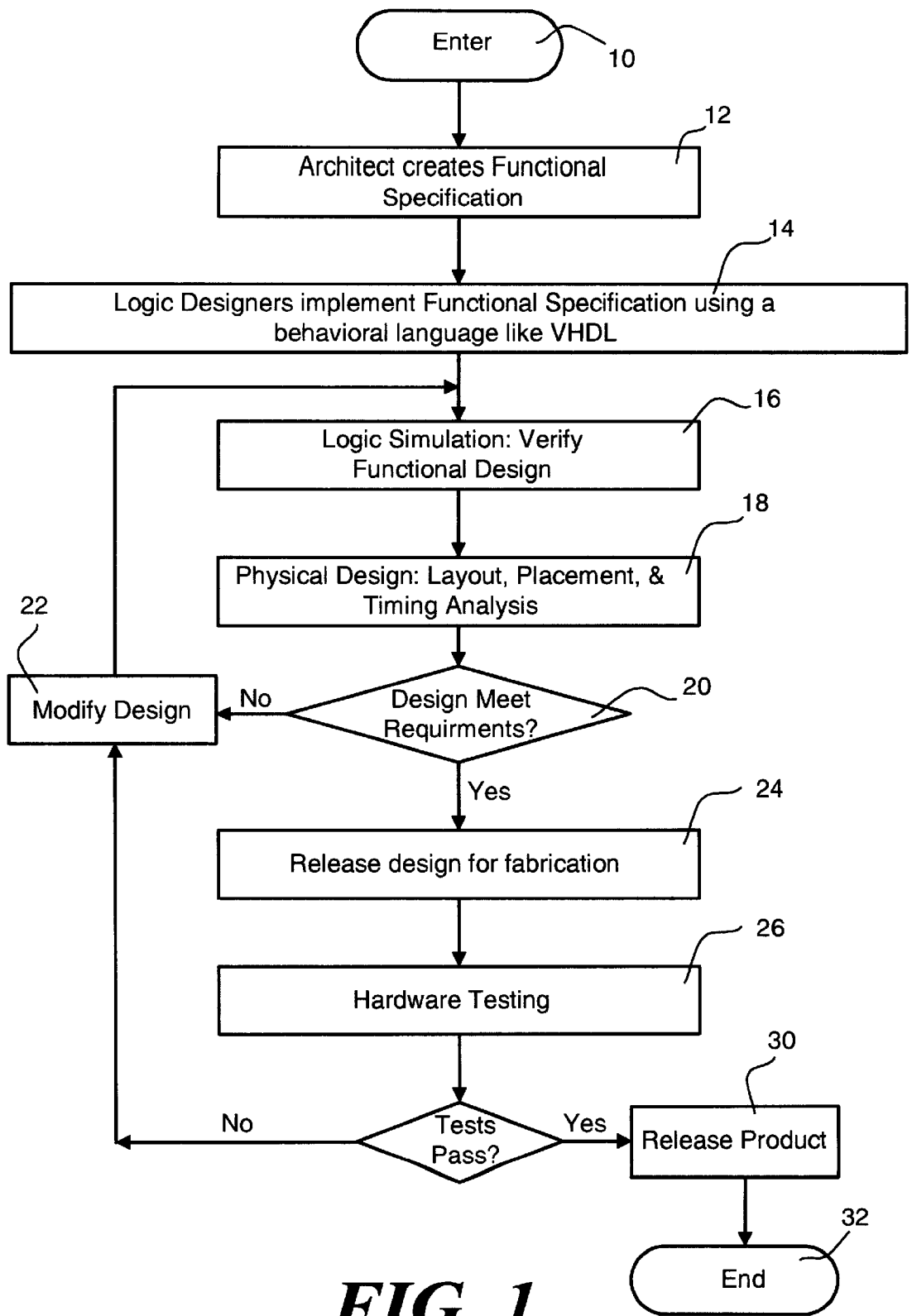
FIG. 1 is a flow diagram showing an illustrative design process in accordance with the prior art.
Figure 2:
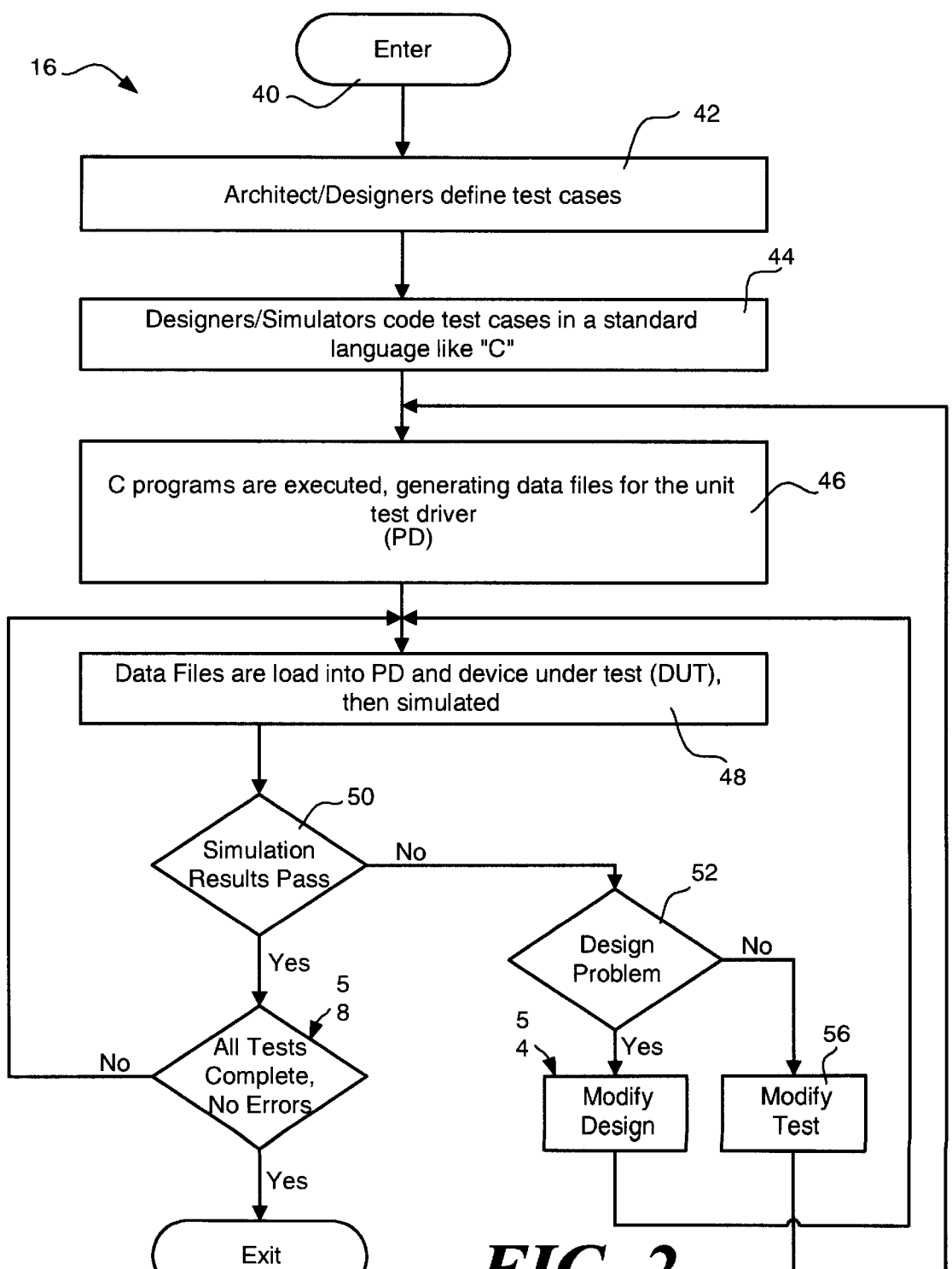
FIG. 2 is a flow diagram showing an illustrative logic simulation process in accordance with prior art.
Figure 3:
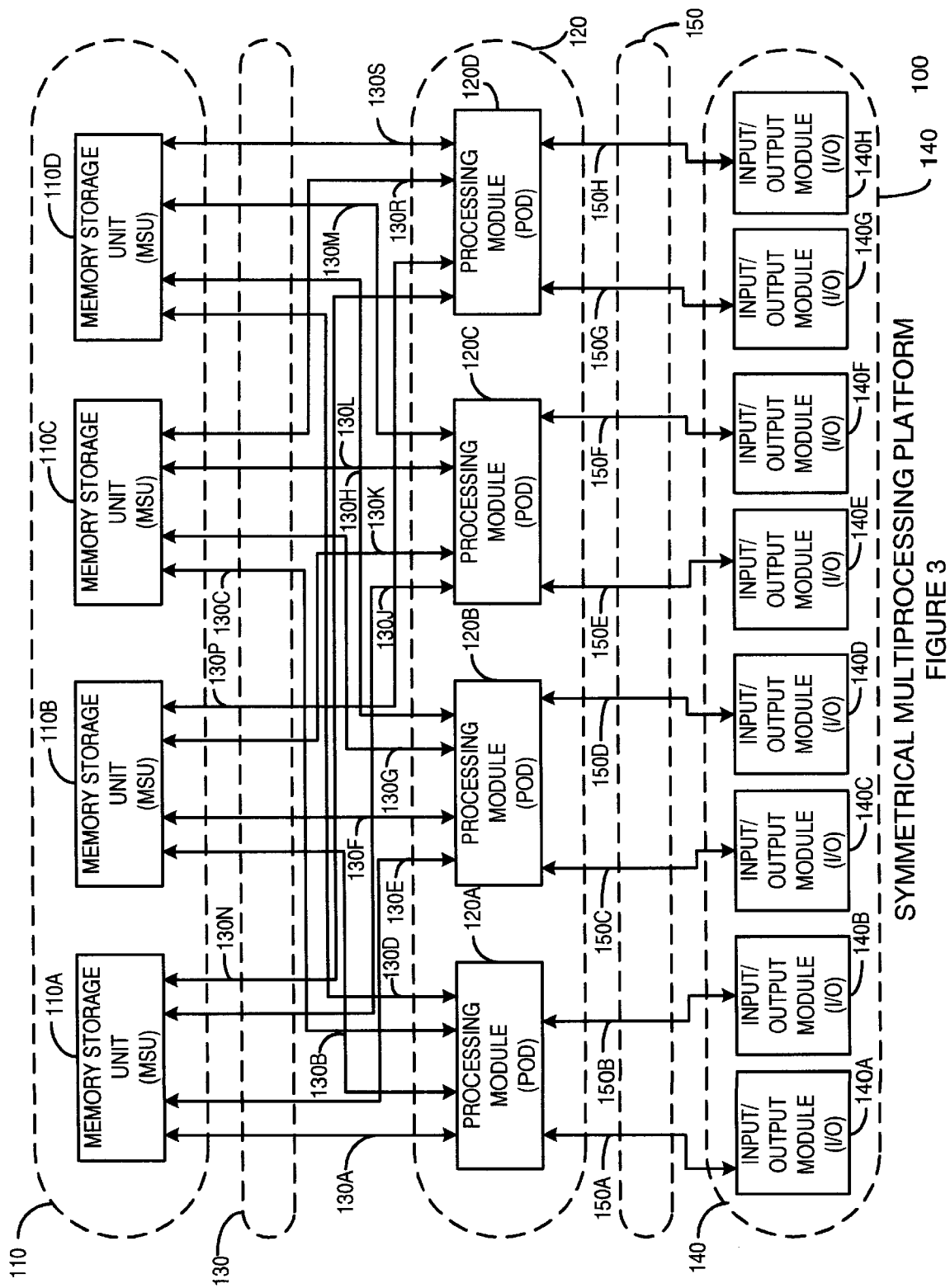
FIG. 3 is block diagram showing an illustrative circuit design including a Symmetrical Multi-Processor (SMP) System Platform.

For illustrative purposes only, the present invention is described in conjunction with a Symmetrical Multi-Processor (SMP) System Platform, as shown in FIG. 3. It is recognized, however, that the present invention may be applied to a wide variety of circuit designs and still achieve many or all of benefits described herein. Referring specifically to FIG. 3, the illustrative System Platform 100 includes one or more Memory Storage Units (MSUs) in dashed block 110 individually shown as MSU 110A, MSU 110B, MSU 110C, and MSU 110D, and one or more Processing Modules (PODs) in dashed block 120 individually shown as POD 120A, POD 120B, POD 120C, and POD 120D. Each unit in MSU 110 is interfaced to all PODs 120A, 120B, 120C, and 120D via a dedicated, point-to-point connection referred to as an MSU Interface (MI) in dashed block 130, individually shown as 130A through 130S. For example, MI 130A interfaces POD 120A to MSU 110A, MI 130B interfaces POD 120A to MSU 110B, MI 130C interfaces POD 120A to MSU 110C, MI 130D interfaces POD 120A to MSU 110D, and so on.

POD 120 has direct access to data in any MSU 110 via one of MIs 130. For example, any of PODS 120A–D can communicate with MSU 110A via interfaces MI 130A, MI 130E, MI 130J and MI 130N, respectively. Preferably, each MI interface comprises separate bi-directional data and bi-directional address/command interconnections, and further includes unidirectional control lines that control the operation of the data and address/command interconnections. One of the unidirectional control lines is a POD to MSU address request signal (REQ). This signal starts a POD to MSU request transaction. The bi-directional address/command interconnection provides fields that specify the desired function (FNCT) for the request. For POD to MSU requests, there is preferably a CMD field, an address field, a job number field, and several other fields.

System Platform 100 further comprises Input/Output (I/O) Modules in dashed block 140 individually shown as I/O Modules 140A through 140H, which provide the interface between various Input/Output devices and one of the PODs 120. Each I/O Module 140 is connected to one of the PODS across a dedicated point-to-point connection called the MIO Interface in dashed block 150 individually shown as 150A through 150H. For example, I/O Module 140A is connected to POD 120A via a dedicated point-to-point MIO Interface 150A. The MIO Interfaces 150 are similar to the MI Interfaces 130, but may have a transfer rate that is approximately half the transfer rate of the MI Interfaces because the I/O Modules 140 are located at a greater distance from the PODs 120 than are the MSUs 110.

Figure 4:
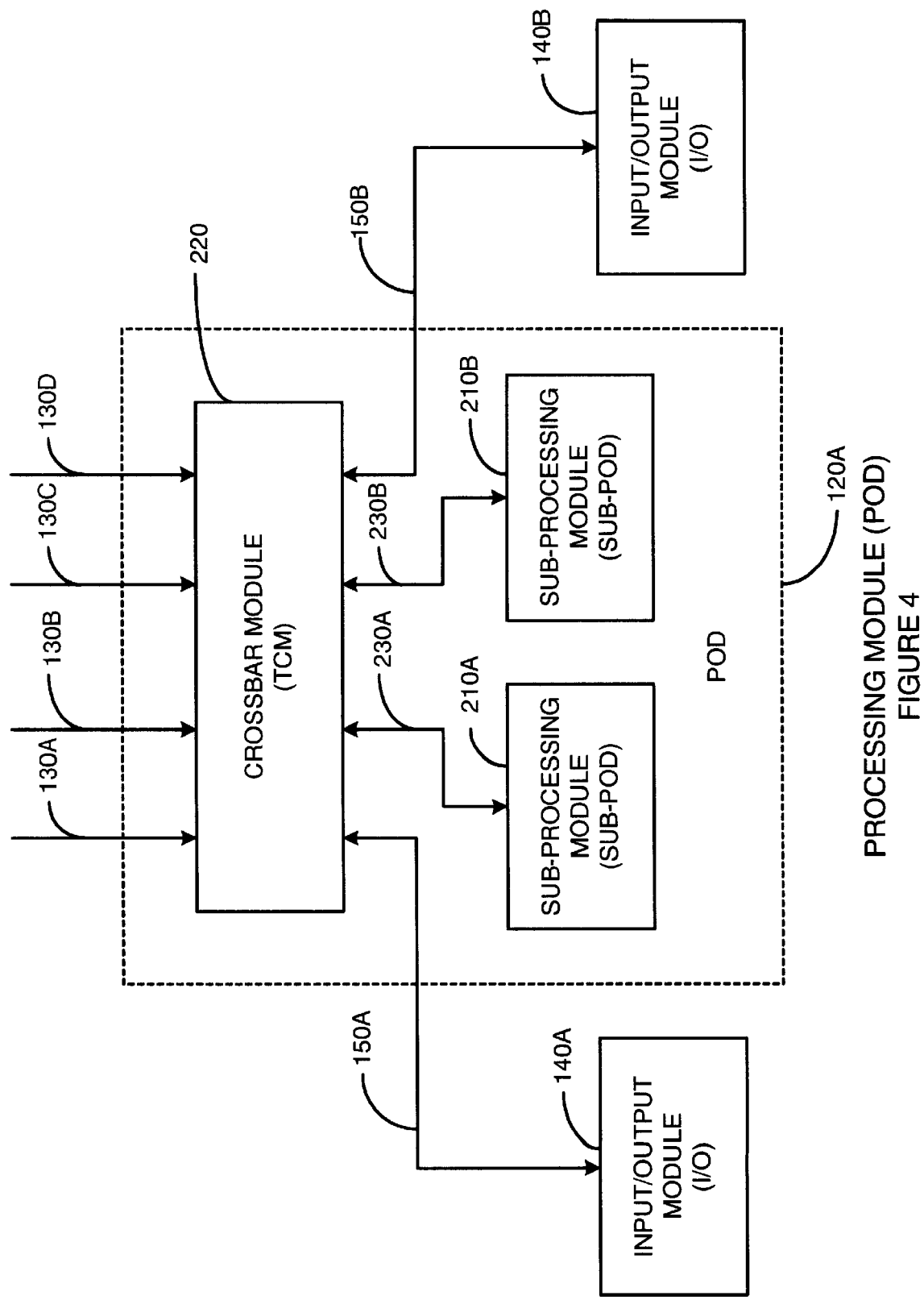
FIG. 4 is a block diagram of one of the processing modules (PODs) of FIG. 3.

FIG. 4 is a block diagram of one of the processing modules (PODs) of FIG. 3. POD 120A is shown, but each of the PODS 120A through 120D may have a similar configuration. POD 120A includes two Sub-Processing Modules (Sub-PODs) 210A and 210B. Each of the Sub-PODs 210A and 210B are interconnected to a Crossbar Module (TCM) 220 through dedicated point-to-point Interfaces 230A and 230B, respectively, that are similar to the MI interconnections 130. TCM 220 further interconnects to one or more I/O Modules 140 via the respective point-to-point MIO Interfaces 150. TCM 220 both buffers data and functions as a switch between Interfaces 230A, 230B, 150A, 150B, and MI Interfaces 130A through 130D. When an I/O Module 140 or a Sub-POD 210 is interconnected to one of the MSUs via the TCM 220, the MSU connection is determined by the address provided by the I/O Module or the Sub-POD, respectively. In general, the TCM maps one-fourth of the memory address space to each of the MSUs 110A–110D. According to one embodiment of the current system platform, the TCM 220 can further be configured to perform address interleaving functions to the various MSUs. The TCM may also be utilized to perform address translation functions that are necessary for ensuring that each processor (see FIG. 5) within each of the Sub-PODs 210 and each I/O Module 140 views memory as existing within a contiguous address space as is required by certain off-the-shelf operating systems.

The I/O Modules 140 may be external to Sub-POD 210 as shown in FIG. 4. This allows system platform 100 to be configured based on the number of I/O devices used in a particular application. In another embodiment configuration, one or more I/O Modules 140 are incorporated into Sub-PODs 120.

Figure 5:
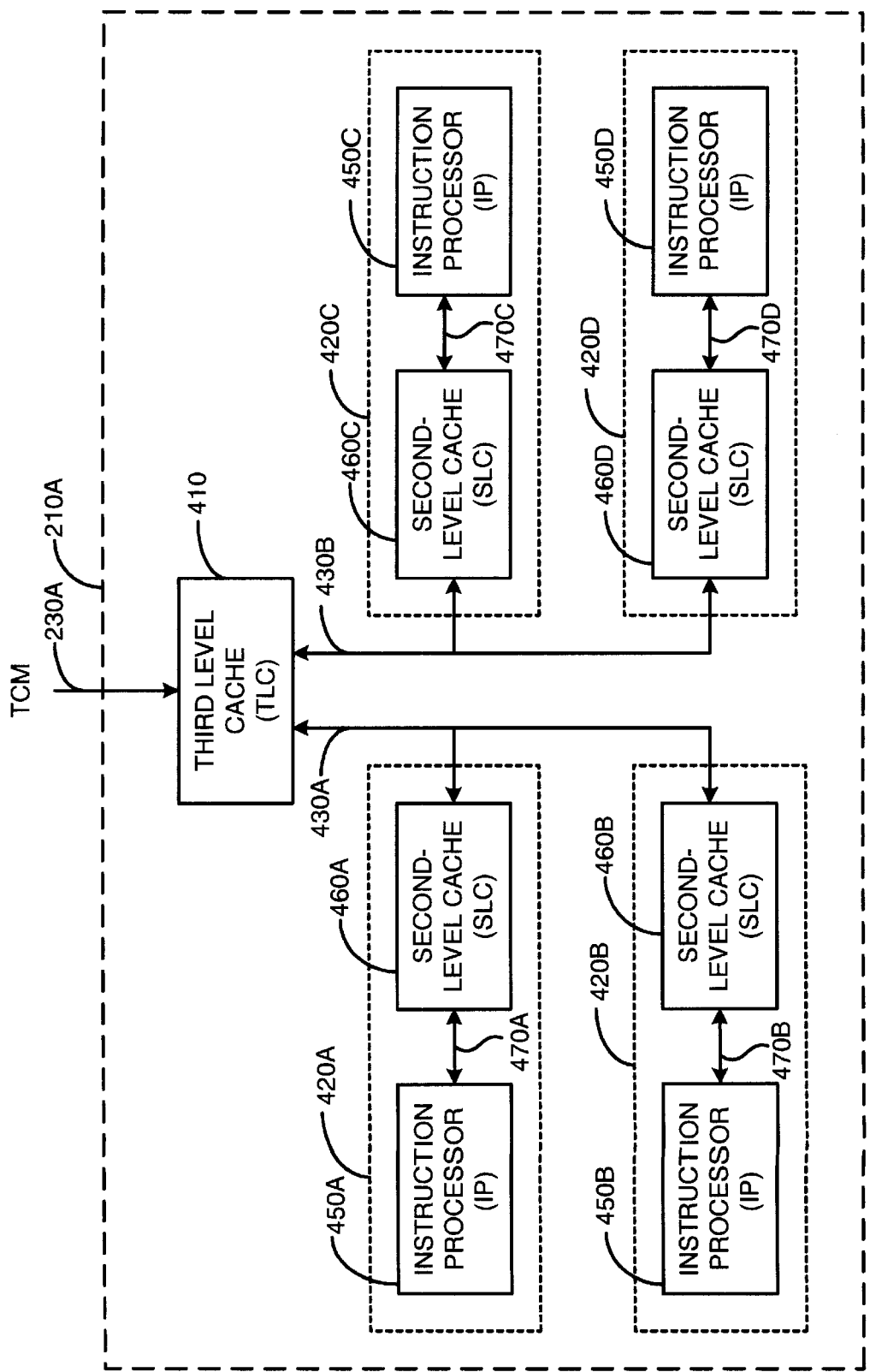
FIG. 5 is a block diagram of one of the Sub-Processing Modules (Sub-PODs) of FIG. 4.

FIG. 5 is a block diagram of one of the Sub-Processing Modules (Sub-PODs) shown in FIG. 4. Sub-POD 210A is shown, but it is understood that all Sub-PODs 210 may have a similar configuration. Sub-POD 210A may include a Third-Level Cache (TLC) 410 and one or more Coherency Domains 420 (shown as Coherency Domains 420A, 420B, 420C, and 420D). TLC 410 is connected to Coherency Domains 420A and 420B via Bus 430A, and is connected to Coherency Domains 420C and 420D via Bus 430B. TLC 410 caches data from the MSU, and maintains data coherency among all of Coherency Domains 420, helping to ensure that each processor is always operating on the latest copy of the data.

Each Coherency Domain 420 includes an Instruction Processor (IP) 450 (shown as IPs 450A, 450B, 450C, and 450D), and a Second-Level Cache (SLC) 460 (shown as SLC 460A, 460B, 460C and 460D.) Each SLC interfaces to an IP via a respective point-to-point Interface 470 (shown as Interfaces 470A, 470B, 470C, and 470D), and each SLC 12 further interfaces to the TLC via Bus 430 (shown as 430A and 430B). For example, SLC 460A interfaces to IP 450A via Interface 470A and to TLC 410 via Bus 430A. Similarly, SLC 460C inter-faces to IP 450C via Inter-face 470C and to TLC 410 via Bus 430B. Each SLC caches data from the TLC as requested by the interconnecting IP 450.

Each of the Interfaces 470 may be similar to the MI Interfaces 130, but may have a transfer rate that is approximately twenty-five percent higher than the transfer rate of each of the MI Interfaces. This difference in transfer rates creates an asynchronous boundary between Interfaces 470 and the MI Interfaces 130. This asynchronous boundary is managed by staging registers in the TCM 220.

IP 450 and SLC 460 may be integrated in a single device, such as in a Pentium Processing device available from the Intel Corporation. Alternatively, the IP 450 may be a A-Series Instruction Processor or a 2200-Series Instruction Processor, both commercially available from the Unisys Corporation. In this latter configuration, the IP 450 is externally coupled to an SLC 460.

A further discussion of the Symmetrical Multi-Processor (SMP) System Platform 100 shown and described with reference to FIGS. 3–5 can be found in co-pending U.S. patent application Ser. No. 08/965,004, filed Nov. 5, 1997, entitled "A Directory-Based Cache Coherency System"; U.S. patent application Ser. No. 08/964,606, filed Nov. 5, 1997, entitled "Message Flow Protocol for Avoiding Deadlocks"; U.S. patent application Ser. No. 09/001,588, filed Dec. 31, 1997, entitled "High-speed Memory Storage Unit for a Multiprocessor System Having Integrated Directory and Data Storage Subsystems"; and U.S. patent application Ser. No. 09/001,592, filed Dec. 31, 1997, entitled "High-Performance Modular Memory System with Crossbar Connections", all assigned to the assignee of the present invention and all incorporated herein by reference.

Figure 6:
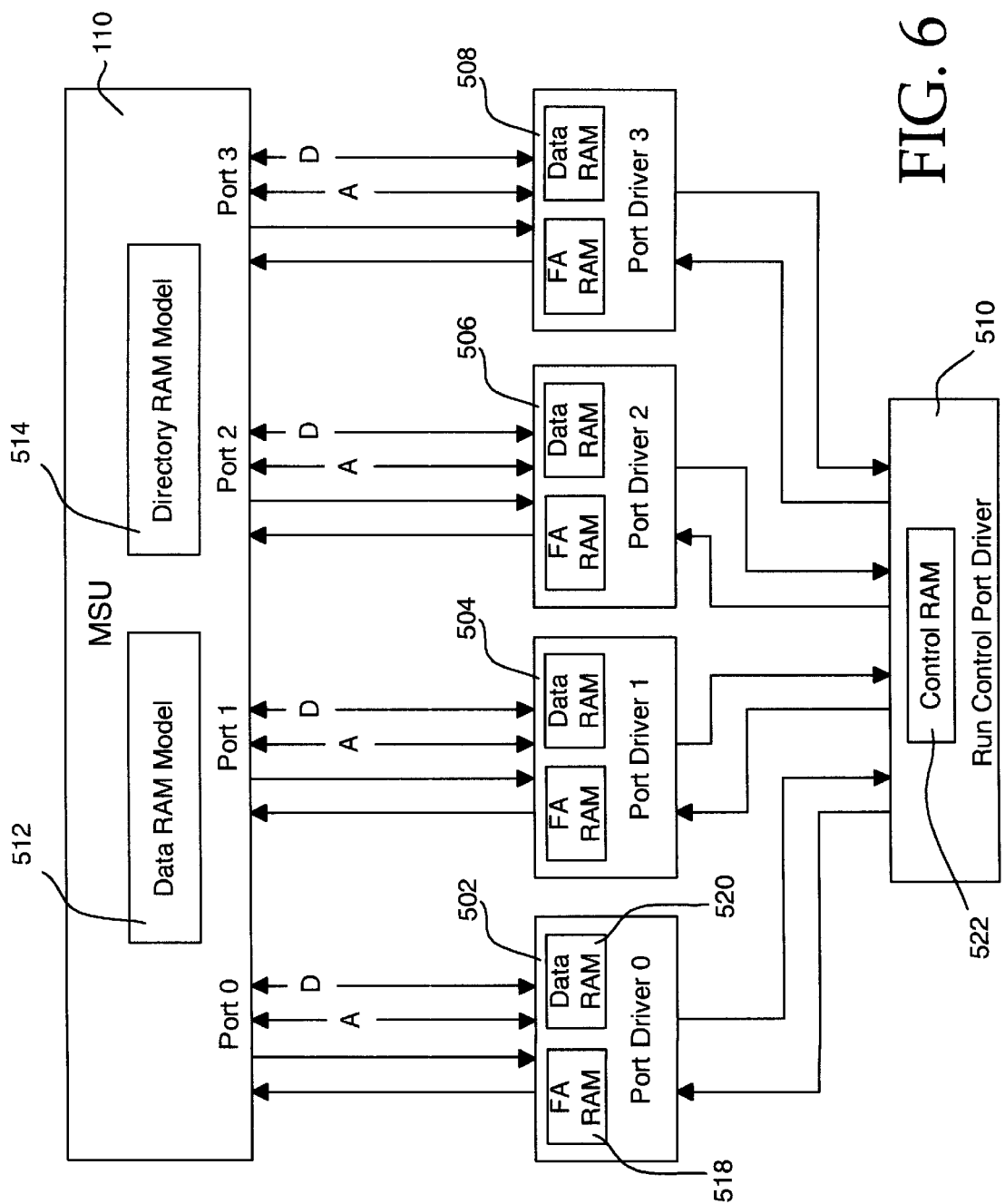
FIG. 6 is an illustrative schematic for functionally simulating the MSU 110 of FIG. 3.

FIG. 6 is an illustrative schematic for functionally simulating the MSU 110 of FIG. 3. There are three main types of entities in this diagram. The first includes the four port MSU 110, which represents the device-under-test or circuit design, and is further described above with respect to FIG. 3. The second is the four Port Drivers 502, 504, 506 and 508, which drive and receive the input and output signals of the MSU 110. The third is the Run Control Port Driver 510. The Run Control Port Driver selectively controls the synchronization of the test cases that are executed by each of the four Port Drivers 502, 504, 506 and 508. The four port drivers 502, 504, 506, and 508, and the run control driver 510 are test drivers, to aid in the simulation of the MSU 110.

In the illustrative embodiment, the MSU 110 has two types of RAM (Random Access Memory) models. One is the Data RAM Model 512 and the other is the Directory RAM Model 514. The Data RAM model 512 contains the cache line information that is transferred to and from the MSU via the Data lines connected to the four ports. The Directory RAM model 514 contains the state information for each cache line in the Data Ram Model 512. Both of the RAM Models are initially loaded with information from data files that are generated using a spreadsheet template and a computer program, as more fully described below.

The four Port Drivers 502, 504, 506 and 508 preferably provide test vectors such as Commands, Addresses and Data to the MSU 110. In an illustrative embodiment, each of the Port Drivers 502, 504, 506 and 508 may stimulate the MSU 110, and verify the response provided by the circuit design. The Port Drivers preferably verify both the data returned by the MSU 110 as a result of executing a command, and the control signals provided by the MSU 110 that control the transfer mechanisms. Each of the Port Drivers 502, 504, 506 and 508 also preferably responding to selected requests provided by MSU 110, such as return, purge or other requests. By receiving and responding to selected requests, each Port Driver 502, 504, 506 and 508 may allow more varieties of circuit designs to be simulated at a lower level of logic simulation.

Preferably, the Port Drivers 502, 504, 506 and 508 each contain two RAM Models, including an FA RAM model and a Data RAM model. The FA RAM model, for example FA RAM model 518, is preferably loaded with lists of instructions that represent a test case for a particular MSU port. The data files that contain the compiled lists of instructions are preferably generated by a C programs, which are derived from parameters provided in a spreadsheet template. An example spreadsheet template is shown in FIG. 7 below.

The Run Control Port Driver (RCPD) 510 preferably coordinates the execution of the instructions in the four port drivers 502, 504, 506 and 508. For example, the RCPD 510 may start one port driver, while leaving the other three in a halted state; or start all four port drivers simultaneously. The particular test case will, of course, dictate the order and sequence of the execution of the port drivers. The RCPD 510 operates under program control based on the instructions loaded in Control RAM 522 prior to simulation. The compiled instructions are located in files that are generated by the above-referenced C programs. Preferably, the RCPD instructions are automatically generated by using the position of the Port Driver commands within the spreadsheet template. A further discussion of the RCPD 510 can be found in U.S. patent application Ser. No. 09/218,812, filed Dec. 22, 1998, entitled "Method and Apparatus For Synchronizing Independently Executing Test Lists For Design Verification".

Figure 7:
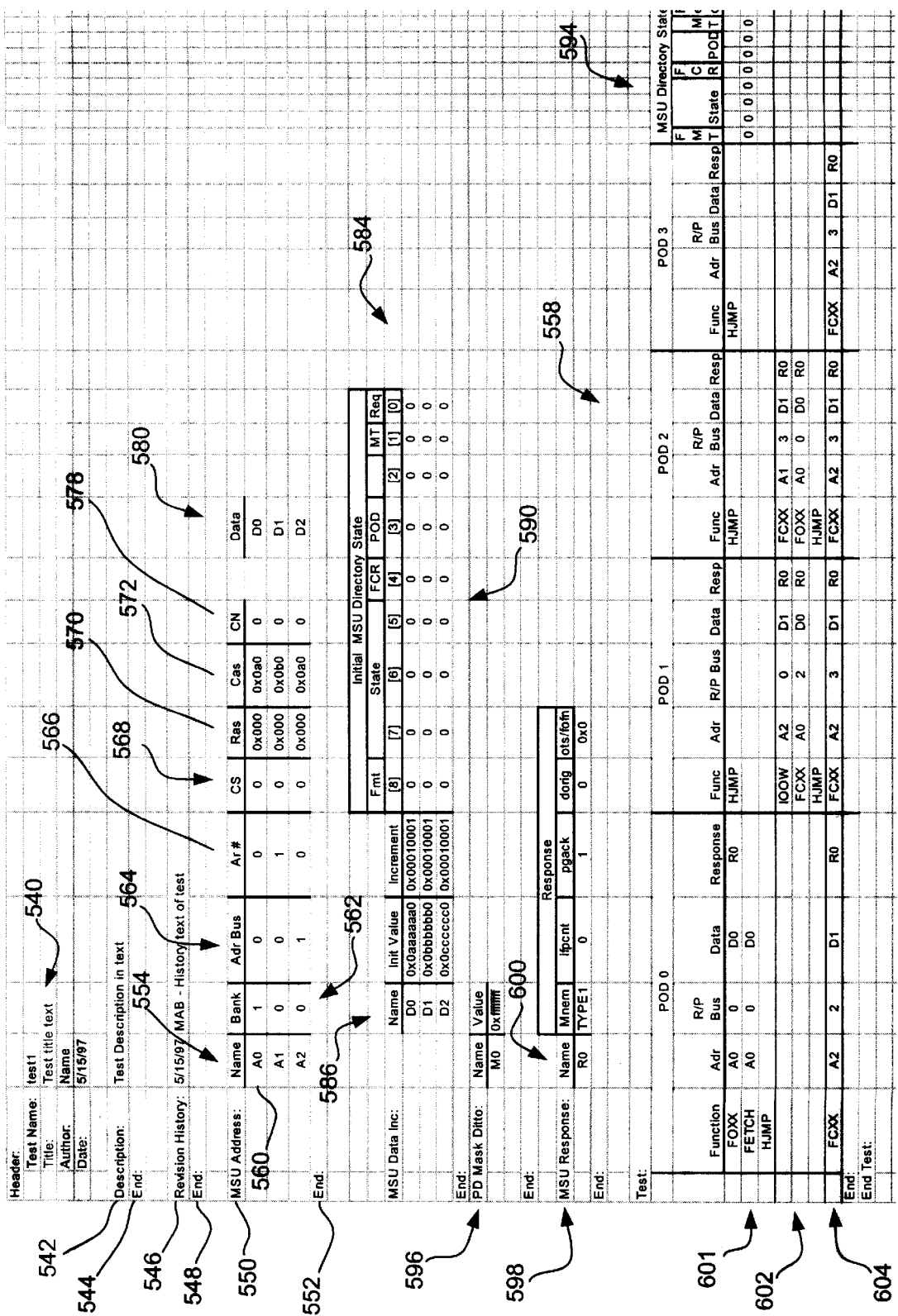
FIG. 7 is a diagram of an illustrative spreadsheet template that may be used to generate C programs, which in turn, may generate the test and initialization files for the Port Drivers, Run Control Port Driver and MSU of FIG. 6.

FIG. 7 is a diagram of an illustrative spreadsheet template that may be used to generate C programs, which in turn, may generate the test and initialization files for the FA and Data RAMs of port drivers 502, 504, 506, and 508; the instructions for the Control RAM 522 of the RCPD 510; and the test and initialization files for the Data RAM Model 512 and the Directory RAM Model 514 of the MSU 110. A further discussion of the generation of the test files from the spreadsheet template can be found in U.S. patent application Ser. No. 09/218,384, filed Dec. 22, 1998, entitled "Method And Apparatus For Efficiently Generating Test Input For A Logic Simulator".

In the illustrative spreadsheet template, Test Area 558 defines three primary test cases 601, 602 and 604. In doing so, the test area 558 includes five main areas, one for each of four port drivers 502, 504, 506 and 508 (labeled as POD 0 through POD 3), and one for the MSU Directory State Table 594. Each of the port driver regions includes five main fields: Function, Address (Adr), R/P Bus, Data, and Response. Each port driver has the capability of executing various types of commands. Some of the commands are strictly port driver control commands, and others are commands that are issued and interpreted by the MSU 100.

The first test case 601 directs Port Driver-0 502 to fetch data from the MSU (FOXX) at address A0, and compare the data received with the value specified by label "D0", which also happens to be the same value that was initially loaded into the MSU 100 at address "A0" as indicated at 160. The first test case 601 also compares the response received with that specified by "R0". Port Driver-0 502 retrieves the directory state information (FETCH) for address "A0" and compares the value returned with the value stated in the columns under the MSU Directory State. Finally, the first test case 601 halts until the RCPD tells it to continue. During the first test case 601, Port Drivers 1–3 remain idle.

The second test case 602 is executed when the RCPD has detected that all four port drivers have halted and no outstanding jobs remain pending. At this time, the RCPD 510 starts up Port Driver-1 504 and Port Driver-2 506, as they have functions specified in the second test case 602. The second test case 602 directs Port Driver-1 504 to issue an I/O write (IOOW) command using address A2 and data D1, and expect to see a response RO. Port Driver-1 504 is then directed to issue a fetch command (FCXX) using address A0 and verify the data received with the value specified for D0 and a response of R0, then halt. Port Driver-2 506, on the other hand, is directed to issue a fetch copy (FCXX) command followed by a fetch original (FOXX) command, comparing the specified data and response values.

When the second test case 602 is complete, the RCPD starts up all four Port Drivers to execute the third test case 604. During the third test case 604, each Port Driver 502, 504, 506 and 508 fetches the data (as modified in the second test case 602) from the MSU 110. Each Port Driver then compares the results against "D1" and "R0". The third test case 604 is an example of a test case that executes all four port drivers in parallel.

As can be seen, each of the port drivers is preferably controlled by a separate and independently executing test list. Further, the test lists are preferably only synchronized at selected synchronization points, under the control of the Run Control Port Driver. In the illustrative diagram, the synchronization points are designated with a HJMP command, which causes the corresponding port driver to stop reading new FA instructions, and wait for all outstanding requests to be completed (all stacked requests sent and all expected responses are received). At this point, the HJMP command asserts a HJMP signal. Because the port drivers operate independently with respect to one another during each test, the precise order that selected commands occur may be unknown. Further, it may be difficult to determine if a desired port driver actually gained access to the corresponding cache line during the simulation.

In the example shown, port driver-1 fetches a copy of the cache line at address "A0" during the second test case 604, and port driver-2 fetches the original of address "A0". The three instructions executed by port driver-1, however, preferably operate asynchronously, and in a non-deterministic manner relative to the three instructions executed by port driver-2 during the second test case 602. Thus, the Fetch copy (FCXX) instruction executed by port driver-i may be executed before or after the Fetch Original (FOXX) instruction executed by port driver-2. If the Fetch copy (FCXX) instruction is executed by port driver-1 before the Fetch Original (FOXX) instruction executed by port driver-2, for example, the MSU may issue a return request to port driver-1 causing the requested cache line to be returned to the MSU and ultimately to port driver-2. Thus, it may be difficult to determine if port driver-1 ever gained access to the requested cache line by simply examining a final result.

To help overcome this limitation, the present invention contemplates modifying a selected portion of the cache line each time a port driver gains access to the cache line. Gaining access means reading, writing, flushing and/or performing any other action relative to the cache line. Each port driver preferably modifies a different portion of the cache line. Thus, by analyzing each cache line, the circuit designer may determine which port drivers gained access thereto during the simulation. A further discussion of modifying selected portions of the cache line to identify which port drivers gained access to selected cache lines can be found with reference to FIGS. 13–15 below.

Figure 8:
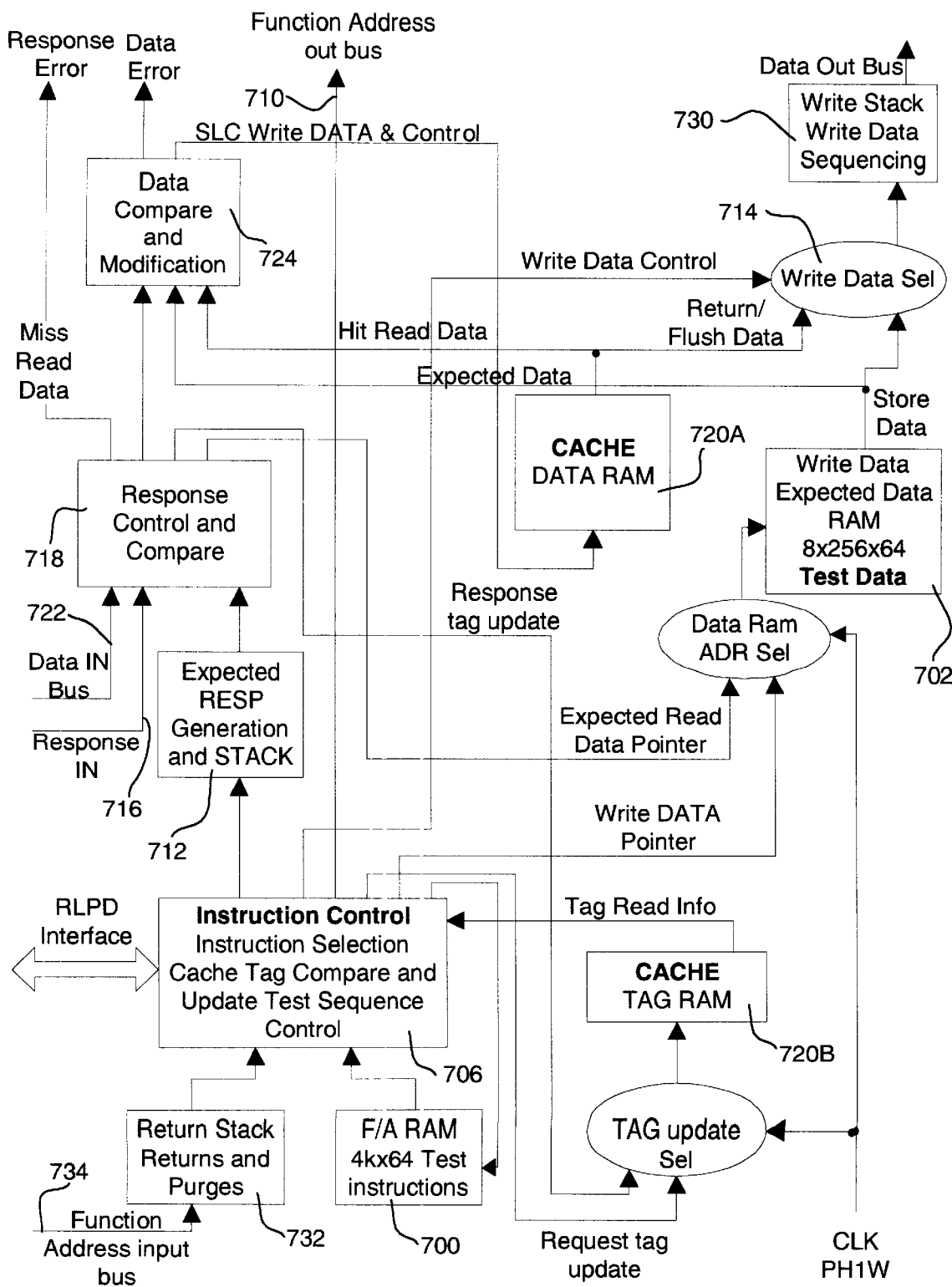
FIG. 8 is a block diagram of one of the port drivers of FIG. 6.

FIG. 8 is a block diagram of one of the port drivers shown in FIG. 6. The port driver is designed to test all of the coherency and ordering functions of the MSU 110, as well as the normal Fetch and Store operations of a memory. As shown in FIG. 6, a port driver is connected to each of the four ports of the MSU 110. Accordingly, each port driver must emulate a POD, and therefore, must be able to send requests that appear to come from two I/O modules and two Sub-PODs (see FIGS. 3–4).

The MSU 110 keeps track of the Ownership and/or Copy state for each cache line. When a port driver makes a request for a cache line that is currently owned by another port driver, the MSU requires the owning port driver to return the cache line or purge any copies therefrom. The port driver must keep track of which sub-unit it sent the request from and be able to respond to coherency functions sent from the MSU. To do this the port driver has a Cache that holds the data and tag info and also tracks which of the 4 sub-units has ownership or copies of the cache lines.

Figure 9:
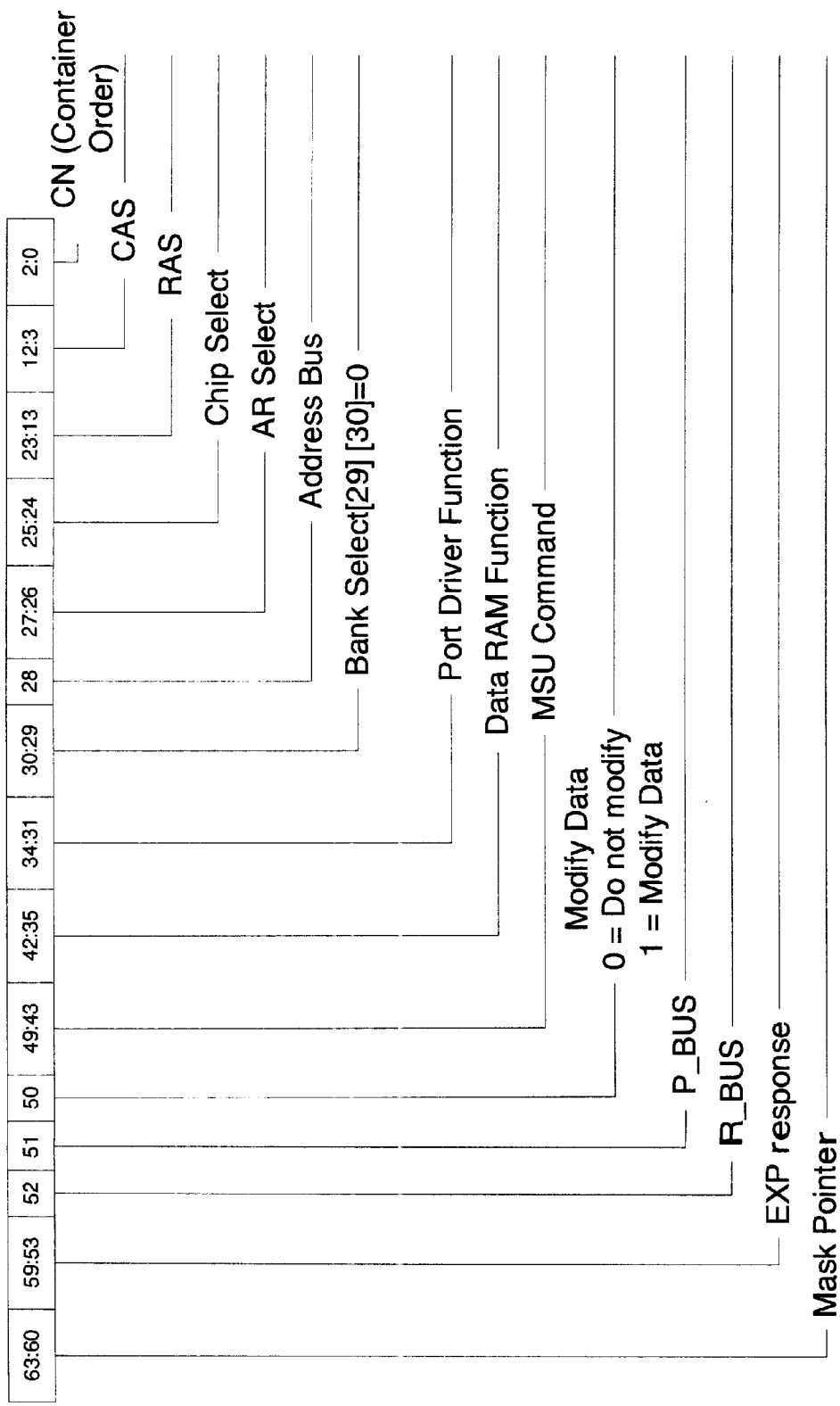
FIG. 9 shows illustrative fields of the FA RAM.

The port driver executes a sequence of instructions(test) which are loaded into the Function Address(F/A) RAM 700 and uses data that is loaded into the Test Data RAM 702. The instructions may contain a function, an address, a data pointer, and some information for verifying responses and data masking. The data pointer is an address for the Test Data RAM 702 pointing to Data that will be used for either write data for Stores or as compare data for Fetches. Illustrative fields of an FA RAM instruction are shown in FIG. 9.

As the tests are executed, the port driver selects instructions from either the F/A RAM 700 or from the Return stack 732 if the MSU has sent coherency functions. The Instruction Control section 706 chooses the functions and sends the requests out on the FA bus 710. It also sends information to the Expected Response generation block 712 and sends the data pointer to the write data select block 714 if the function is a Store or Send Message. The port driver can have up to 15 outstanding fetch requests at one time. The requests are tracked with a Job number that is sent back with any MSU response.

When the MSU sends a Response via Response interface 716, the Response Control block 718 uses the Job number to look up the information needed to write the data into the Cache 720 and keep track of the sub-unit that now has a Copy or Ownership of the Cache line. It can also perform a Data Modify operation as the data is written to the Cache 720. The Data Modify is used to verify that the latest data is returned to the MSU 110 and received by the next requester of the requested cache line. On a Fetch and Modify operation, for example, each port driver instance will only modify its assigned container. The entire container will be changed by a Store operation supplied by the test. An illustrative data modification algorithm is shown and described more fully with reference to FIGS. 13–15 below.

The MSU ensures that all requests will get the Latest Data for a given Cache Line. To accomplish this, the MSU performs coherency operations including return Requests and purges to notify previous owners that they need to return ownership or Purge their copies. The port driver uses two special features to verify that the MSU is performing these coherency operations correctly.

As indicated above, the Fetch and Modify operation can be used to verify that the most recent data is returned from an owning port driver and provided to the requesting port driver, rather than receiving old data resident in the MSU. The Cache 720A,B also has the ability to get a cache "HIT" in response to a Fetch request, which causes expected data to be compared to the data in the Cache 720A, with the request never being sent to the MSU.

This Cache Hit feature, along with the Data Modification feature, can be used to verify that purges get sent to sub-units that have copies of selected cache lines. For example, when a requester asks for ownership of a cache line, the requester may modify the data, requiring that all other copies be purged. If a sub-unit that has a copy issues another Fetch Copy, the port driver Cache 720B will check to see if it still has a Copy and would then get a "HIT", but in this case it would have the old data. If a Purge is done, a "MISS" will occur, and the Fetch Copy will be sent to the MSU to get the New data.

The port drivers are also able to return or flush modified or Original data on their own. Since there is only one Cache 720A,B representing four requesters, if one of the requesters owns a cache line, it may have to be flushed to make room for one of the other requesters to use the cache location. Therefore, if another requester or the same requester wants to use a cache location for a different cache line (different Set address) the cache line currently using the location will be flushed back to the MSU before the new requester sends the new Fetch. If another requester wants the same Cache Line, the fetch will be sent and the port driver will let the MSU send the coherency function (return or purge). Then, the old owner will perform the Return of the cache line thus freeing the cache location for the response to the new fetch. Port drivers may also purge data if it has been determined that the data has aged out.

The types of returns received by the port drivers are determined by the coherency function sent by the MSU, and by whether or not the data has been modified by the port driver. The MSU can request returns without data if the data has not been changed (to reduce data bus traffic), returns with data if the data has been changed, or return ownership while maintaining a copy in the local cache 720.

The Response Control and Compare Block 718 receives a "Data IN" signal via interface 722. The MSU provides any data including cache line data to the port driver via the "Data IN" signal. The "Data IN" signal is synchronized with the "Response IN" signal discussed above. The Response Control and Compare block 718 validates the response code, and presents the MSU data to the Data Compare and Modification block 724. The Data Compare and Modification block 724 compares the MSU data against the expected data, and then increments the appropriate container of the cache line. The incremented value is routed to the Cache Data Ram 720A, where it is stored in the Cache. The next reference by the port driver to this location will then be compared against the increment value, rather than the original value. Also, every reference to the cache line thereafter will read the cache line from the cache (assuming the cache is still valid), compare the cache line with an expected value, modified by incrementing the appropriate container, and rewrite the modified cache line to the cache 720A,B.

The port driver Test Data RAM 702 can store 256 unique cache lines. Each FA instruction has a DTPTR field (bits 42:35) that select a location in the Test Data RAM 702. The data from that location will then become either the write data for STORE functions or the expected read data for FETCH functions.

Several GRA type stacks are used inside the port driver to save control information and data that is needed at a later time. For example, the write stack 730 buffers up to 16 cache lines of Write data until they can be sent to the MSU. The Expected Read Data Stack (included in block 702) holds the expected read data. When a Fetch command is sent out, the expected read data is saved in this stack in a location addressed by the JOB number of the fetch request. When the response comes back, the JOB number field in the response is used to read this stack. The read data from MSU is then compared to the stack output to determine if the correct data was read from the MSU.

Return and purge requests provided by the MSU on the function address input bus 734 may be stacked in the Return stack 732 until they can be serviced. Although the Return/Purge functions have priority over all other request types (new FA instructions, saved STORES, saved FETCHES, etc.), they still can get stacked up if one of them runs into a address conflict. The cache line is in a conflict state when the fetch request has been sent to the MSU, but a response has not yet been received.

The Expected Response Block 712 preferably includes an Expected Response Stack. The Expected Response Stack may be addressed by a JOB number. When a request is sent out the expected response information is loaded into this stack. Stored along with the expected response is a response mask value. The expected response and mask value are generated by a combination of hardware and test writer input. Part of the expected response can be predicted by hardware when the request is provided. However, the bits that cannot be predicted are masked out unless they are supplied by the test writer. When a response is received via the Response IN interface 716, the JOB number in the response is used to read the Expected Response Stack and the expected data along with the response mask are used to verify the response.

The Response Control and Compare Block 718 preferably includes a Response Address Save stack. The Response Address Save Stack is used to tie a JOB number back to an MSU address so the port driver cache tag 720B and cache data 720A can be updated when a response is received from the MSU. When a response is received, the only thing to identify the response is the JOB number. The job number is used to read this stack, which contains several pieces of information necessary to maintaining the cache 720 and perform the data compare. The Response Address Save Stack also contains the MSU address, used for addressing the cache tag 720B and cache Data 720A.

FIG. 9 shows a number of illustrative fields for a typical FA RAM instruction. The FA RAM 700 stores the port driver functions as well as the commands and addresses that will be sent to the MSU during a test case. The FA RAM 700 is loaded at the beginning of a simulation from previously generated test files.

Referring specifically to FIG. 9, the Mask Pointer field is a 4-bit pointer value that selects 1 of sixteen unique mask values that can be used when the read data is compared to the expected data. This field has no meaning on store type commands.

The Expected Response field is a 7-bit field that is used to generate expected values for the bits in the MSU Response that can not be predicted by hardware alone.

The R-BUS field is a 1-bit field that sets the R-BUS bit. The R-bus bit indicates to the MSU which of the two TLC's (requester bus) in a POD made the request. The MSU returns this bit as part of a response and also uses it to set the new Directory State value.

The P-BUS field is a 1-bit field that sets the P-BUS bit. The P-bus bit tells the MSU which Processor Bus made the request. There are two processor buses for each TLC. This bit is returned by the MSU as part of the response. It does not affect the directory state.

The MODIFY field is a 1-bit field that the port driver uses to determine if the read data should be modified. There are three special fetch commands that will set this bit including the Fetch Original (FOXX), IO Fetch Original (IOFO), and IO Fetch Original NO Coherency (FONC).

The MSU COMMAND field is a 7-bit field that contains the MSU Command. The DATA RAM ADDRESS field is an 8-bit field that selects a cache line from the Test Data RAM 702 to be used as either write data or expected read data, depending on the function. The Test Data RAM 702 is only 256 locations deep, so the test writer should attempt to re-use as much data as possible.

The Port Driver Function field is a 4-bit field that determines the Port Driver action when this FA packet is read. There are several types of port driver functions such as Loop, Jump, Halt Jump, etc., which are internal functions and do nothing to the MSU. There are also functions that send various types of requests to the MSU.

The AR SELECT field is a 2-bit field that selects one of four AR sections to receive the request. The ADDRESS BUS SELECT is a 1-bit field that selects one of two Address buses that are connected to each AR. The BANK SELECT field is a 1-bit field that selects one of two banks on each Address bus. The CHIP SELECT field is a 2-bit field that selects one of four sets of RAM chips in each bank. The RAS field is an 11-bit Row Address Select used to address the RAMs in the MSU. The CAS field is a 10-bit Column Address Select used to address the RAMs. Finally, the CN field is a 3-bit field used to select which of the eight data containers will be delivered to the requester first, which also then determines the order of the remaining seven containers.

Figure 10:
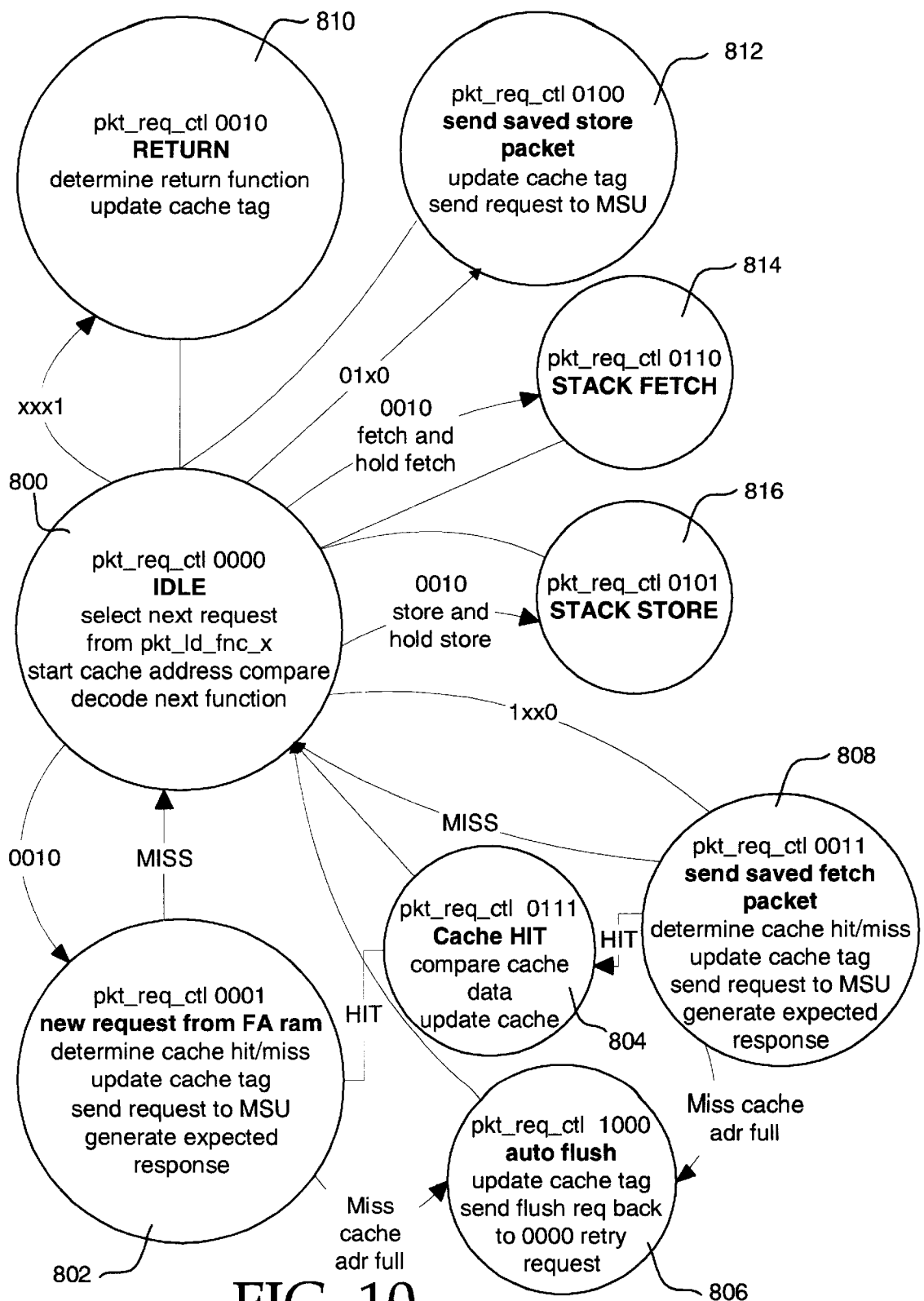
FIG. 10 shows an illustrative state machine for controlling the selection of a next request by a port driver.

FIG. 10 is a flow diagram showing the main request selection made by a port driver. The request can come from the FA RAM 700, the Return Stack 732, Save Fetch, or Save Store stacks. This diagram shows the state selection and gives a basic description of what is occurring in each state.

The port driver may initially start in an IDLE state 800. The IDLE state 800 selects a next request, starts a cache address compare, and decodes the next function. If the next request is from the FA RAM 700, the port driver enters state 802. State 802 decodes the request, and depending on the function, determines if there is a cache hit/miss, updates the cache tag, sends a corresponding request to the MSU, and/or generates an expected response. A more detailed discussion of the operation of state 802 can be found below with reference to FIG. 11.

If the next request is a fetch or store request, and if there is a cache hit, control is passed to state 804. State 804 reads the cache line, compares the cache data with the expected cache data, and updates the cache line accordingly. If there is a cache miss, the fetch or store request is sent to the MSU, the FA address in incremented, and control is passed back to state 800. If the cache address is already used to store another MSU data element, control is passed to state 806. State 806 provides an auto-flush of the cache address and returns control to state 800. The request is then re-executed.

The port driver behaves in a similar manner when the next request is a saved fetch request. That is, when state 800 determines that the next request is a saved fetch request, control is passed to state 808. State 808 decodes the request, and depending on the function, determines if there is a cache hit/miss, updates the cache tag, sends a corresponding request to the MSU, and/or generates an expected response.

If there is a cache hit, control is passed to state 804. State 804 reads the cache line, compares the cache data with the expected cache data, and updates the cache line accordingly. If there is a cache miss, the saved fetch request is sent to the MSU, the FA address in incremented, and control is provided back to state 800. Finally, if the cache address is already used to store another MSU data element, control is passed to state 806. State 806 provides an auto-flush of the cache address and returns control to state 800. The request is then re-executed.

When state 800 determines that the next request is a send saved store request, control is passed to state 812. State 812 decodes the request, updates the cache tag, and sends the request to the MSU. Once sent, control is passed back to state 800.

The stack fetch state 814 provides the fetch request into a fetch stack for later processing. Likewise, the stack store state 816 provides the store request into a store stack for later processing.

When state 800 determines that the next request is a return/purge request, control to state 810. State 810 determines the type of the return request, which may be a purge request, a return purge request, a return copy request or a return purge no data request. State 810 decodes the return function, performs a corresponding function, and updates the cache tag accordingly. A more detailed discussion of the operation of the state 810 can be found below with reference to FIG. 12.

Figure 11:
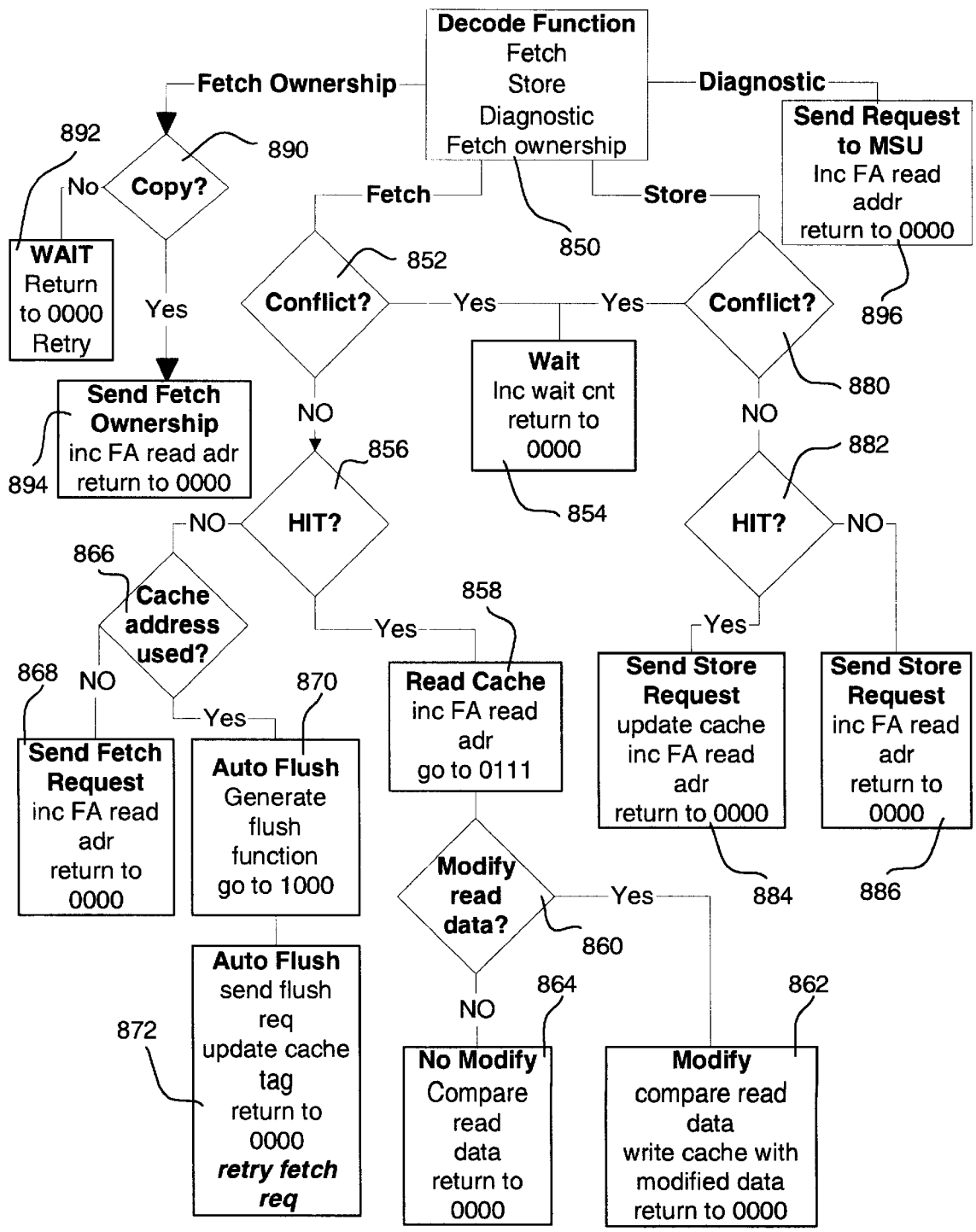
FIG. 11 is a flow diagram showing how a new request from the FA RAM is processed by each driver.

FIG. 11 is a flow diagram showing how a new request from the FA RAM is processed by each port driver. The FA request is first decoded to determine the type of request, as shown at 850. The FA request may be a fetch request, a store request, a diagnostic request, or a fetch ownership request.

If the FA request is a fetch request, control is passed to block 852. Block 852 determines whether there is a conflict in performing the fetch request. A conflict occurs when the corresponding cache line has previously been requested and the port driver is waiting for a response from the MSU. Therefore, another request to the same cache line must wait until the response arrives for the previous request. If there is a conflict, control is passed to block 854. In block 854, a wait count is incremented each time a request is tried. This wait count could be used to detect a hang condition.

If no conflict exists, control is passed to block 856. During a fetch request, the local cache within the port driver is first checked. If there is a cache hit, control is passed to element 858. Element 858 reads the cache line from the local cache in the port driver, and increments the FA read address. This corresponds to state 804 of FIG. 10. As indicated above, state 804 compares the cache data with the expected data, updates the cache, and returns control to state 800.

Returning to FIG. 11, control is then passed to element 860. Element 860 determines whether the cache line has been modified, for example, by the data compare and modification block 724 of FIG. 8. As indicated above, the cache line may be modified during a fetch request to help identify which port drivers gained access to the cache line during a particular test case. If the read data was modified, control is passed to block 862. Block 862 compares the read data with the expected read data, writes the modified cache line back to the cache, and returns control to state 800 of FIG. 10. If the read data was not modified, control is passed to element 864. Element 864 merely compares the read data with the expected read data, and returns control to state 800 of FIG. 10.

Referring back to element 856, if the fetch request did not result in a cache hit, control is passed to element 866. Element 866 determines if the request cache address is already used. If the requested cache address is not already used, control is passed to element 868. Element 868 send the fetch request to the MSU, increments the FA read address, and returns control to state 800 of FIG. 10. If, however, the requested cache address is already used, control is passed to element 870. Element 870 performs an auto-flush of the requested cache address, as shown at state 806 of FIG. 10. Control is then passed to element 872, wherein the flush request is sent, the cache tag is updated, and control is passed back to state 800 of FIG. 10. State 800 then retries the fetch request.

Referring back to element 850, if the FA request is a store type of request, control is passed to element 880. Element 880 determines if there is a conflict, indicating that the requested cache line has previously been requested and the port driver is waiting for a response from the MSU. If there is a conflict, control is passed to element 854. As indicated above, element 854 increments a wait count each time the request is tried. The wait count could be used to detect a hang condition problem.

If a conflict is not detected, control is passed to element 882. Element 882 determines whether the store request results in a hit, indicating that the cache line is already stored in the local cache. If there is a cache hit, control is passed to element 884. Element 884 sends the store request to the MSU, updates the cache, increments the FA read address, and returns control to state 800 of FIG. 10. If, however, there is not a cache hit, control is passed to element 886. Element 886 sends the store request to the MSU, increments the FA read address, and returns control to state 800 of FIG. 10.

Referring back to element 850, if the FA request is a fetch ownership type request, control is passed to element 890. Element 890 determines whether the local cache has a copy of the requested cache line. If the local cache does not have a copy of the requested cache line, control is passed to element 892. Element 892 waits, returns control to state 800 of FIG. 10, and retries the fetch ownership request later. If the local cache does have a copy of the requested cache line, control is passed to element 894. Element 894 sends the fetch ownership request to the MSU, increments the FA read address, and returns control to state 800 of FIG. 10.

Referring back to element 850, if the request is a diagnostic type request, control is passed to element 896. Element 896 sends the diagnostic request to the MSU, increments the FA read address, and returns control to state 800 of FIG. 10.

Figure 12:
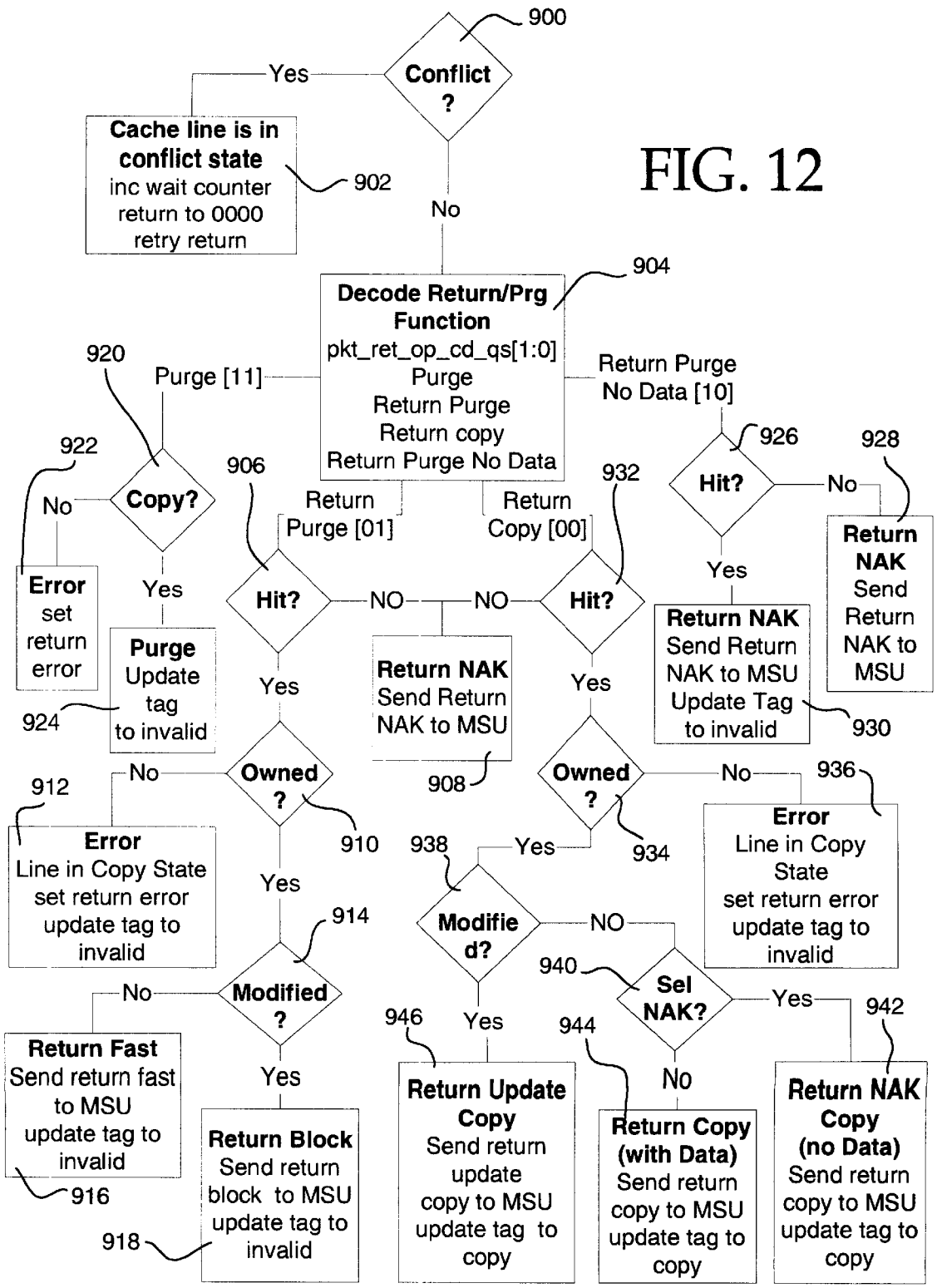
FIG. 12 is a flow diagram showing how a Return/Purge function may be processed by each port driver.

FIG. 12 is a flow diagram showing how a Return/Purge function may be processed by a port driver. The flow diagram is entered at element 900. Element 900 determines whether the cache line to be returned to the MSU is in a conflict state, indicating that the cache line has previously been requested and the port driver is waiting for a response from the MSU. If the requested cache line is in a conflict state, control is passed to element 902. Element 902 increments a wait counter, then returns control to state 800 of FIG. 10, wherein the return request is retried. If the requested cache line is not in a conflict state, control is passed to element 904. Element 904 decodes the return/purge request. The return/purge request may be a purge request, a return purge request, a return copy request, or a return purge no data request. If the return/purge request is a return purge type of request, control is passed to element 906. Element 906 determines whether the return/purge request results in a cache hit, indicating that the requested cache line is stored in the local cache. If a cache hit is not detected, control is passed to element 908. Element 908 returns an acknowledge to the MSU. If a cache hit is detected, control is passed to element 910. Element 910 determines whether the port driver owns the requested cache line. If the port driver does not own the requested cache line, control is passed to element 912. Element 912 issues an error. If the port driver does own the requested cache line, control is passed to element 914. Element 914 determines whether the requested cache line has been modified. If the requested cache line has not been modified, control is passed to element 916. Element 916 executes a return fast request to the MSU which only updates the tag information in the MSU, and not the data portion. The data portion need not be updated because the MSU already has a most-updated copy of the cache line. If the requested cache line has been modified by the port driver, control is passed to element 918. Element 918 sends the requested cache line (or block) to the MSU and updates the local cache tag data for the requested cache line in the port driver to invalid.

Referring back to element 904, if the return/purge request is a purge type request, control is passed to element 920. Element 920 determines if the local cache merely has a copy of the requested cache line. If the local cache does not have a copy of the requested cache line, control is passed to element 922. Element 922 issues an error. If the local cache does have a copy of the requested cache line, control is passed to element 924. Element 924 purges the requested cache line from the local cache. This typically involves updating the cache tag data for the requested cache line to an invalid value.

Referring back to element 904, if the return/purge request is a return purge no data type request, control is passed to element 926. Element 926 determines whether a cache hit is detected, thereby indicating that the requested cache line is in the local cache. If a cache hit is not detected, control is passed to element 928. Element 928 returns an acknowledge signal back to the MSU. If, however, a cache hit is detected, control is passed to element 930. Element 930 sends an acknowledge to the MSU and updates the tag information in the local cache for the request cache line to invalid. That is, requested cache lines not provided back to the MSU.

Referring back to element 904, if the return/purge request is a return copy type request, control is passed to element 932. Element 932 determines whether a cache hit is detected, thereby indicating if the requested cache line is in the local cache. If a hit is not detected, control is passed to element 908. Element 908 issues a return acknowledge signal to the MSU.

If, however, a cache hit is detected, control is passed to element 934. Element 934 determines whether the port driver currently owns or has ownership rights to the requested cache line. If the port driver does not currently own the cache line, control is passed to element 936. Element 936 issues an error. If, however, the port driver does own the requested cache line, control is passed to element 938. Element 938 determines whether the requested cache line has been modified by the port driver. If the requested cache line has not been modified by the port driver, control is passed to element 940. Element 940 determines whether a NAK has been selected. Depending on the processor model used, either a Return NAK Copy (No Data) or a Return Copy (Data) is provided. If a NAK has been selected, control is passed to element 942. Element 942 returns a NAK copy to the MSU and updates the local tag data to indicate a copy still exists in the port driver. If a NAK is not selected, control is passed to element 944. Element 944 returns a copy of the requested cache line to the MSU, and updates the local tag data to indicate that the port driver still has a copy of the requested cache line.

Referring back to element 938, if the port driver modified the request cache line, control is passed to element 946. Element 946 returns the updated copy of the requested cache line to the MSU, and updates the tag information associated with the requested cache line in the port driver to indicate that the port driver maintains a copy therein.

Figures 13, 15:
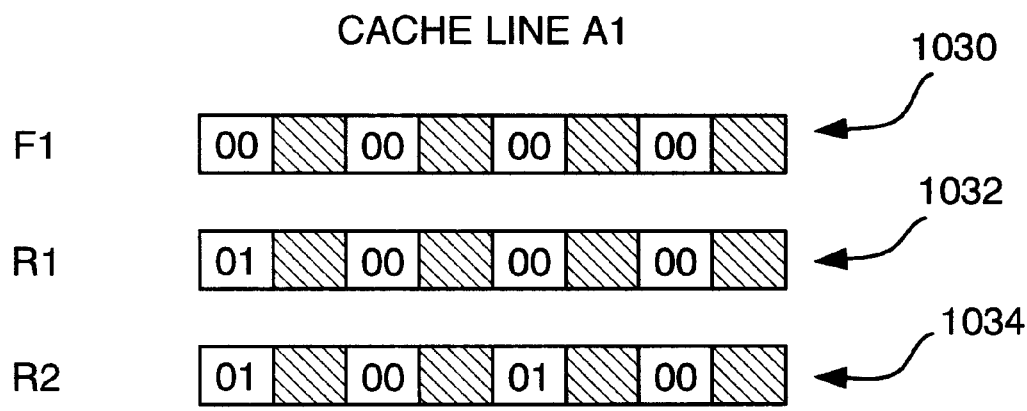
FIG. 13 shows an illustrative cache line with eight defined containers, some of which correspond specific port driver instances.
FIG. 15 is a schematic diagram showing illustrative modifications that are made to the cache line during the test case of FIG. 14.

FIG. 13 shows an illustrative cache line with eight defined containers, some of which correspond to specific port driver instances. As indicated above, each port driver may modify a selected portion of the cache line each time the port driver fetches and/or stores the cache line. The cache line preferably is divided into eight containers. Containers 0, 2, 4 and 6 are preferably incremented by a first, second, third and fourth port driver, respectively. The remaining containers 1, 3, 5, and 7 preferably contain a fixed pattern, and are not modified by the port drivers. By examining the value of each container, the test designer may be able to identify which port driver gained access to each cache line. The test designer may also be able to identify how many times each port driver gained access to each cache line.

Figure 14:
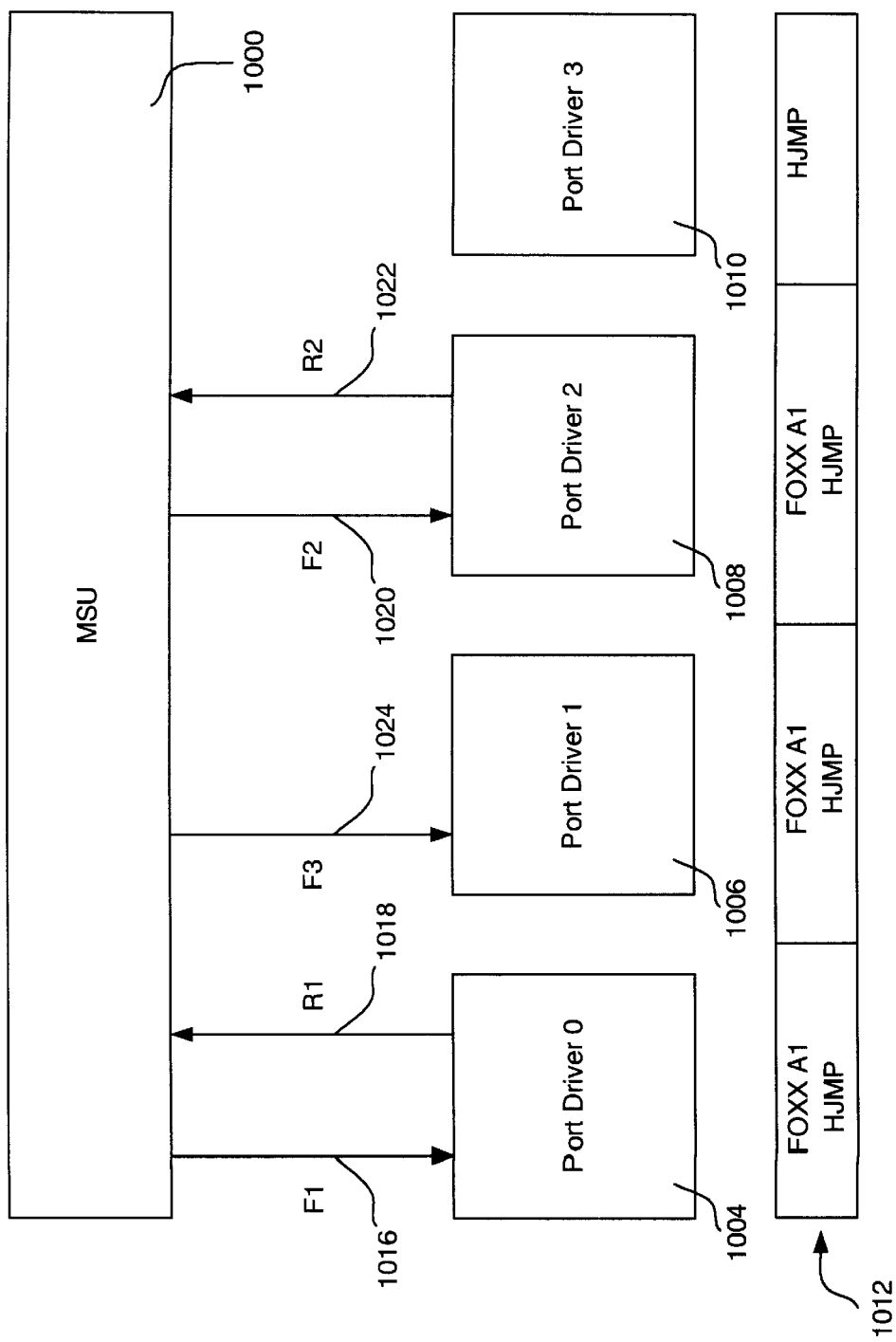
FIG. 14 is a schematic diagram showing an illustrative test case wherein three of the four Port Divers provide a fetch original request (FOXX) to the same address A1 in MSU.

FIG. 14 is a schematic diagram showing an illustrative test case wherein three of four Port Drivers provide a fetch original request (FOXX) to the same address A1 in MSU 1000. This test case may simulate the interaction of three independently operating ports of the MSU. The first, second, third and forth ports of the MSU 1000 are connected to first 1004, second 1006, third 1008 and forth 1010 port drivers, respectively. A test list for each port driver is shown at 1012. The test lists indicate that the first, second and third port drivers each must execute a fetch original request of MSU address A1, and then a halt jump command (HJMP). The HJMP command causes the corresponding port driver to stop reading new FA instructions, and wait until all outstanding requests are completed (all stacked requests sent and all expected responses are received). Since each of the test lists is executed independently from one another between HJMP commands, it is difficult to predict the order that the fetch original requests will be processed. It may also be difficult to determine if each of the first, second and third port drivers actually gained access to the cache line at address A1.

It is contemplated that each of the port drivers 1004, 1006, and 1008 may increment a designated container of the cache line (see FIG. 13) each time the cache line is received and/or written using the local cache of the corresponding port driver. This may help determine how many times each port driver gained access to the requested cache line. The original cache line preferably has an initial value of zero in each of containers –0, –2, –4, and –6, as shown at 1030 of FIG. 15. Other initial values are contemplated.

In FIG. 14, the first port driver 1004 provides a fetch original request F1 to the MSU 1000, as shown at 1016. In response, the MSU 1000 provides the requested cache line to the first port driver 1004. The first port driver 1004 then stores the requested cache line in the local cache. The first port driver 1004 also preferably increments container–0 of the cache line.

After the fetch original request F1 of the first port driver 1004 is completed, the third port driver 1008 is shown providing a fetch original request F2 to the MSU 1000, as shown at 1020. Since the first port driver 1004 now maintains ownership of the requested cache line, the MSU 1000 issues a return request to the first port driver 1004. The first port driver 1004 responds by returning the requested cache line R1 1018, with the incremented container–0, to the MSU 1000. The requested cache line having an incremented container–0 is shown at 1032 of FIG. 15. The MSU 1000 then passes the requested cache line R1 to the third port driver 1008, as shown at 1020. The third port driver 1008 receives the requested cache line R1 and stores the cache line in its local cache. The third port driver 1008 also preferably increments container–4 of the cache line.

Subsequently, the second port driver 1006 is shown issuing a fetch original request F3 to the MSU 1000, as shown at 1024. Since the third port driver 1008 now owns the requested cache line, the MSU 1000 issues a return request to the third port driver 1008. The third port driver 1008 responds by returning the requested cache line R2 1022, with the incremented containers –0 and –4, to the MSU 1000. The requested cache line R2 having an incremented container–0 and –4 is shown at 1034 of FIG. 15. The MSU 1000 then passes the requested cache line R2 to the second port driver 1006, as shown at 1024.

As can readily be seen, the values stored in each of the containers of a cache line can be used to determine which of the port drivers gained access to the cache lines. This may be helpful in determining which port drivers gained access, and how many times each port driver gained access to a particular cache line.

Having thus described the preferred embodiments of the present invention, those of skill in the art will readily appreciate that yet other embodiments may be made and used within the scope of the claims hereto attached.

What is claimed is:

1. A port driver for controlling a port of a multi-port memory module during a functional simulation, wherein the functional simulation simulates the multi-port memory module with selected ports connected to corresponding port drivers, each port driver selectively providing requests to obtain and/or release ownership of a requested cache line from the multi-port memory module, and said each port driver making these requests independently of the other port drivers, when the requested cache line is currently owned by an owning port driver the multi-port memory module provides a return request to the owning port driver requesting the return of the requested cache line to the multi-port memory module, wherein the multi-port memory module directs the requested cache line to the requesting port driver, said each port driver comprising:

local cache means for storing selected cache lines including the requested cache line; and return controller means for controlling return requests provided by the multi-port memory module, said return controller retrieving the requested cache line from the local cache, and modifying a designated portion of the requested cache line before returning the requested cache line to the multi-port memory module.

2. A port driver according to claim 1, wherein the designated portion of the requested cache line is incremented.

3. A port driver according to claim 1, wherein said local cache means includes both a data portion and a tag portion, wherein the tag portion provides a correlation between the selected cache lines in the data portion and corresponding cache lines in the multi-port memory module.

4. A port driver according to claim 3, wherein said return controller means accesses the tag portion of the cache to determine if the port driver has a copy of the selected cache lines, and if so, returns the requested cache lines to the multi-port memory module.

5. A port driver according to claim 3, further comprising:

instruction store means for storing a number of predetermined instructions, selected instructions providing requests to the multi-port memory module, some of the requests being read type requests for requesting a selected cache line from the multi-port memory module and placing the selected cache line in the local cache, and some of the requests being write type requests for writing a write data packet to the multi-port memory module.

6. A port driver for controlling a port of a multi-port memory module during a functional simulation, wherein the functional simulation simulates the multi-port memory module with selected ports connected to corresponding port drivers, each port driver providing requests to obtain and/or release control of selected cache lines in the multi-port memory module, and said each port driver making these requests independently of the other port drivers, said each port driver comprising:

a local cache store for storing selected cache lines, the local cache including both a data portion and a tag portion, wherein the tag portion provides a correlation between said selected cache lines in the data portion and corresponding cache lines in the multi-port memory module;

an expected data store for storing a number of expected data packets including a number of expected read data packets and a number of write data packets;

an instruction store for storing a number of predetermined instructions, selected instructions providing requests to the multi-port memory module, at least some of which result in a response from the multi-port memory module, some of the requests being write type requests for writing one of the write data packets to the multi-port memory module, and some of the requests being read type requests for reading a selected cache line from the multi-port memory module and placing the selected cache line in the local cache; and a compare block for comparing selected responses provided by the multi-port memory module with a selected one of the expected data packets.

7. A port driver according to claim 6, further comprising a return controller for controlling return requests provided by the multi-port memory module, selected return requests requesting the return of selected cache lines from the local cache to the multi-port memory module, said return controller accessing the tag portion of the cache to determine if the port driver has a copy of the selected cache lines, and if so, returns the requested cache lines to the multi-port memory module.

8. A port driver according to claim 7, wherein the return controller also controls purge requests provided by the multi-port memory module, wherein in response to a purge request, the return controller purges selected cache lines in the cache.

9. A port driver according to claim 8, wherein the return controller initiates some purge requests without receiving a purge request from the multi-port memory module.

10. A port driver according to claim 7, further comprising a data modification block for modifying the requested cache line before the requested cache line is returned to the multi-port memory module, the data modification block only modifying a selected portion of the requested cache line.

11. A system for modeling a multi-port memory module during functional simulation, wherein each port of the multi-port memory module is controlled by a separate port driver, and each port driver providing requests to obtain and/or release selected cache lines in the multi-port memory module, the system comprising:

the multi-port memory module;

a number of port drivers coupled to respective ports of the multi-port memory module, said each port driver making selected requests to the multi-port memory module independently of the other port drivers, said each port driver including;

a local cache for storing said selected cache lines, each local cache including both a data portion and a tag portion, wherein the tag portion provides a correlation between the selected cache lines in the data portion and corresponding cache lines in the multi-port memory module;

an instruction store for storing a number of predetermined instructions, selected instructions providing requests to the multi-port memory module, at least some of which cause the multi-port memory module to provide a return request to another one of the port drivers indicating that a selected cache line should be returned to the multi-port memory module and ultimately directed to a requesting port driver; and a return controller for controlling return requests provided by the multi-port memory module, said return controller accessing the tag portion of the local cache to determine if the port driver has a copy of the selected cache line, and if so, returns the selected cache line to the multi-port memory module.

12. A system according to claim 11, wherein at least some of the requests provided by the selected instructions result in a response from the multi-port memory module to the requesting port driver.

13. A system according to claim 12, wherein some of the requests are write type requests for writing a write data packet to the multi-port memory module, and some of the requests are read type requests for reading a requested cache line from the multi-port memory module.

14. A system according to claim 13, wherein the read type requests causes the multi-port memory module to provide a response to the requesting port driver, wherein the response includes the requested cache line.

15. A system according to claim 14, wherein the requested cache line is stored in the local cache of the requesting port driver.

16. A system according to claim 13, wherein said each port driver further comprises:
    an expected data store for storing a number of expected data packets including a number of expected read data packets and a number of write data packets; and
    a compare block for comparing selected responses provided by the multi-port memory module with a selected one of the expected data packets.

17. A system according to claim 11, wherein said each port driver further includes a data modification block for modifying the selected cache line before the requested cache line is returned to the multi-port memory module, the data modification block of said each port driver modifying a different portion of the selected cache line.

18. A method for determining which port driver requests are serviced during a simulation of a multi-port memory module with each port of the multi-port memory module connected to a port driver, each port driver selectively providing said port driver requests to the multi-port memory module requesting ownership of selected cache lines, the multi-port memory module having a number of cache lines and a corresponding directory store for storing directory information for each of the cache lines, the multi-port memory module checking the directory information to determine which port driver, if any, currently owns a requested cache line when one of the port driver requests ownership of the requested cache line, when another port driver currently owns the requested cache line, the multi-port memory module providing a return request to the port driver that is identified as currently owning the requested cache line, the return request indicating that the requested cache line should be returned to the multi-port memory module whereby the multi-port memory module then provides the requested cache line to a requesting port driver, the method comprising the steps of:
    receiving the return request from the multi-port memory module, the return request indicating that the requested cache line should be returned to the multi-port memory module; modifying only a selected portion of the requested cache line, the selected portion of the requested cache line being dependent on which port driver is modifying the requested cache line; and returning the modified requested cache line to the multi-port memory module.

19. A method according to claim 18, wherein the requested cache line has a number of bits, and the selected portion of the requested cache line only includes a subset of the number of bits.

20. A method according to claim 19, wherein the modifying step includes the step of incrementing the subset of the number of bits.

21. A method according to claim 19, wherein said each port driver modifies a different subset of the number of bits.

22. A method according to claim 21, wherein the return request is received by a first port driver, and the first port driver modifies a first subset of the number of bits.

23. A method according to claim 22, wherein another return request is received by a second port driver, and the second port driver modifies a second subset of the number of bits, wherein the first subset and the second subset are non-overlapping.

* * * * *